US012719185B2

(12) United States Patent
Sir et al.

(10) Patent No.: US 12,719,185 B2
(45) Date of Patent: Aug. 25, 2026

(54) CONNECTOR TO ELECTRICALLY COUPLE MULTIPLE SUBSTRATES

(71) Applicant: Intel Corporation, Santa Clara, CA (US)

(72) Inventors: Jiun Hann Sir, Gelugor (MY); Eng Huat Goh, Ayer Itam (MY); Poh Boon Khoo, Perai (MY); Chin Mian Choong, Georgetown (MY); Jooi Wah Wong, Bukit Mertajam (MY); Jia Yun Wong, Pulau (MY)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 17/955,369

(22) Filed: Sep. 28, 2022

(65) Prior Publication Data

US 2024/0106139 A1 Mar. 28, 2024

(51) Int. Cl.

| | |
|---|---|
| ***H01R 12/57*** | (2011.01) |
| ***H01R 12/52*** | (2011.01) |
| ***H01R 12/79*** | (2011.01) |
| ***H01R 13/03*** | (2006.01) |
| ***H01R 13/508*** | (2006.01) |
| ***H01R 43/20*** | (2006.01) |
| ***H10W 90/00*** | (2026.01) |
| ***H10W 90/22*** | (2026.01) |

(52) U.S. Cl.

CPC ........... *H01R 12/57* (2013.01); *H01R 12/526* (2013.01); *H01R 12/79* (2013.01); *H01R 13/03* (2013.01); *H01R 13/508* (2013.01); *H01R 43/205* (2013.01); *H10W 90/00* (2026.01); *H10W 90/22* (2026.01); *H10W 90/724* (2026.01); *H10W 90/754* (2026.01)

(58) Field of Classification Search

CPC ...... H01R 12/57; H01R 12/526; H01R 12/79; H01R 12/00; H01R 12/52; H01R 13/03; H01R 13/508; H01L 25/0652; H01L 25/105; H10W 90/00; H10W 90/22; H10W 90/724; H10W 90/754

USPC ............................................ 439/666, 65, 61

See application file for complete search history.

(56) References Cited

U.S. PATENT DOCUMENTS

| | | | | |
|---|---|---|---|---|
| 4,220,382 A * | 9/1980 | Ritchie | .............. | H01R 12/7088 439/267 |
| 4,505,528 A * | 3/1985 | Reimer | .................. | H01R 12/89 439/260 |
| 4,995,814 A * | 2/1991 | Weidler | ............... | H01R 25/162 439/856 |

(Continued)

*Primary Examiner* — Gary F Paumen

(74) *Attorney, Agent, or Firm* — Schwabe, Williamson & Wyatt, P.C.

(57) ABSTRACT

Embodiments herein relate to systems, apparatuses, or processes for a connector for a modular memory package that includes one or more memory dies on a substrate, where the connector directly electrically couples electrical contacts at an edge and on each side the substrate of the memory package to electrical contacts at an edge and on each side of another substrate that includes a compute die. The connector may include a first plurality of leads that are substantially parallel with each other, and a second plurality of leads that are substantially parallel with each other that are below the first plurality of leads and electrically couple the two substrates. Other embodiments may be described and/or claimed.

19 Claims, 19 Drawing Sheets

(56) References Cited

U.S. PATENT DOCUMENTS

| | | | | |
|---|---|---|---|---|
| 6,431,876 | B1 * | 8/2002 | Svenkeson | H01R 12/78<br>439/62 |
| 6,923,655 | B2 * | 8/2005 | Korsunsky | H01R 12/85<br>439/637 |
| 7,045,891 | B2 * | 5/2006 | Choi | H01R 12/721<br>257/726 |
| 2008/0293262 | A1 * | 11/2008 | Duesterhoeft | H01R 12/616<br>439/631 |
| 2012/0190219 | A1 * | 7/2012 | Pai | H01R 12/721<br>439/65 |
| 2014/0162470 | A1 * | 6/2014 | Fricker | H01R 12/523<br>439/65 |

* cited by examiner

MEMORY PACKAGE
SOC
CPU/GT

900A2
973
942
900A1
973
942
942

900B2
942
974
900B1
942
974

900C2
942
900C1
942
976a
974
976b
942

900D2
976a
982
974
973
976b 976a
942
974
980
991
976b
900D1

1200
1210
INTEGRATED CIRCUIT (DIE)
1216
ON-DIE MEMORY SRAM; EDRAM
1212
PROCESSOR
1214
COMMUNICATIONS CIRCUIT
1211
INTEGRATED CIRCUIT (DIE)
1217
ON-DIE MEMORY SRAM; EDRAM
1213
PROCESSOR
1215
COMMUNICATIONS CIRCUIT
1240
EMBEDDED MEMORY
1248
REMOVABLE MEDIA
1246
HARD DRIVE(S)
1244
MAIN MEMORY (RAM)
1242
VOLTAGE SOURCE
1230
PASSIVE DEVICE(S)
1220
DISPLAY
1250
AUDIO
1260
INPUT DEVICE(S)
1270

CONNECTOR TO ELECTRICALLY COUPLE MULTIPLE SUBSTRATES

FIELD

Embodiments of the present disclosure generally relate to the field of package assemblies, and in particular package assemblies that include magnetic cores.

BACKGROUND

Continued reduction in end product size of mobile electronic devices such as smart phones and ultrabooks is a driving force for the development of reduced size systems that include processors coupled with memory modules.

DETAILED DESCRIPTION

Figure 1:
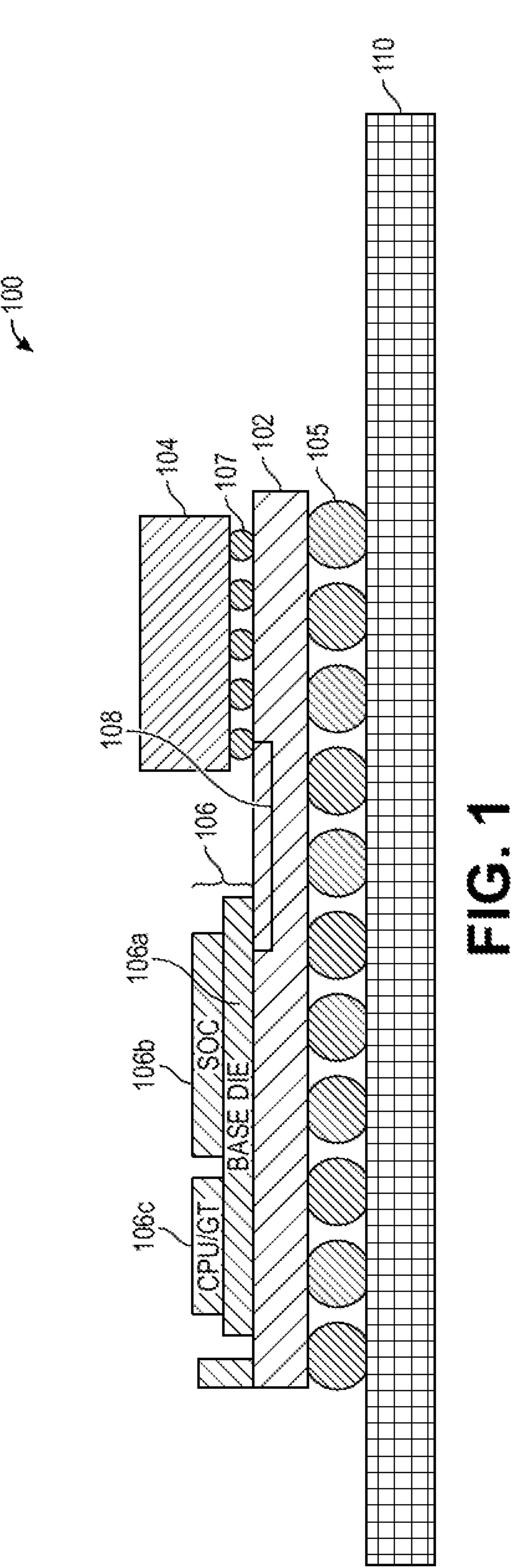
FIG. 1 shows a cross section side view of a legacy package that includes a substrate that includes die complex coupled with a memory die.

Embodiments of the present disclosure may generally relate to systems, apparatus, techniques, and/or processes directed to a connector used in a modular memory package, and in particularly a modular memory package that includes one or more memory dies on a substrate, where the connector directly electrically couples the substrate of the memory package to another substrate that includes a die. In embodiments, the die may be a die complex. In embodiments, the connector, which may be referred to as a connector bridge or a bridge connector, may include a first plurality of leads, which may be referred to as wires, that are substantially parallel with each other, and a second plurality of leads that are substantially parallel with each other that are below the first plurality of leads.

In embodiments, the connector will directly electrically couple the substrate of the memory package with a substrate of the die. In embodiments, the first plurality of leads electrically couple a first plurality of contacts at the edge of a top surface of the modular memory package substrate with a second plurality of contacts at the edge of a top surface of the die substrate. In embodiments, the second plurality of leads electrically couple a third plurality of contacts at the edge of a bottom surface of the modular memory package substrate with the fourth plurality of contacts at the edge of the bottom surface of the die substrate.

In embodiments, the first plurality of leads and the second plurality of leads may be mechanically coupled to form the connector. The ends of the first plurality of leads and the second plurality of leads may be curved to form a spring so that when the first plurality of leads and the second plurality of leads are compressed onto the modular memory package substrate or the die substrate a quality electrical coupling with their respective contacts is formed. In embodiments, the first plurality of leads may be physically coupled with a first cover, which may be referred to as a top cover, and the second plurality of leads may be physically coupled with a second cover, which may be referred to as a bottom cover. In embodiments, the first cover and/or the second cover may include metal shielding, which may be at least in part electrically coupled with one or more of the first plurality of leads or with one or more of the second plurality of leads.

In embodiments, a locking mechanism may physically couple the first cover and the second cover at a maximum distance from each other, in order to keep the first plurality of leads and the second plurality of leads compressed against their respective contacts on the first substrate and the second substrate. In embodiments, and anchoring mechanism may be used that may physically couple the first plurality of leads and/or the second plurality of leads to a location on the modular memory package substrate and/or the die substrate to prevent lateral movement of the first plurality of leads or the second plurality of leads across the surface of the substrates.

In embodiments, the connector will facilitate high speed double data rate (DDR) electrical connections between a die and memory modules, without requiring the die and the memory modules to be directly coupled with the same substrate. Furthermore, memory modules may be easily replaced without having to disassemble the memory from a substrate. In embodiments, a plurality of modular memory packages may be coupled to one or more edges of a die substrate to provide scalable high-speed memory to the die.

In embodiments, the die substrate may be physically and electrically coupled with a motherboard. In these embodiments, the motherboard may include one or more physical features on the surface of the motherboard that may act as physical supports when one or more modular memory packages are connected to the die substrate using one or more connectors. These one or more physical features may keep the respective substrates of the modular memory packages at a same level as the die substrate, while allowing the one or more modular memory packages to be easily coupled or decoupled from the die substrate.

In embodiments, modular memory package substrates that are coupled to die substrates using the connector may provide better performance than low power DDR memory solutions that may be directly physically and electrically coupled on a motherboard, or equivalent performance than low power DDR memory solutions that may be directly physically and electrically coupled with a die substrate.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 shows a cross section side view of a legacy package that includes a substrate that includes a die complex coupled with a memory die. Legacy package 100 is an example of an on-package memory (OPM), where a substrate 102 is coupled with a memory package 104 and with a die complex 106 on a side of the substrate 102 through electrical routings 108 within the substrate 102. In implementations, the die complex 106 may include a base die 106*a* that has a system on chip (SOC) 106*b* and a CPU 106*c* coupled with the base die 106*a*. The memory package 104 may be coupled with the substrate 102 using a ball grid array (BGA) 107.

In implementations, if the memory package 104 needed to be replaced, the memory package 104 would need to be disassembled from the substrate 102 by melting the BGA 107 and removing the memory package 104. In this legacy implementation, the structural integrity of the legacy package 100 may be compromised, particularly if the substrate 102 is coupled with a printed circuit board (PCB) 110, for example a motherboard, using a ball grid array 105. In particular, the mechanical stress placed upon the package 100 during removal of the memory package 104 may cause stress fractures in the BGA 105 and result in the legacy package 100 not functioning correctly.

In addition, it is very difficult to add additional memory (not shown but similar to memory package 104) to the legacy package 100 without removing the legacy package 100 from the system (not shown), and physically attaching the additional memory (not shown) to the substrate 102 using soldering or other techniques.

Figure 2:
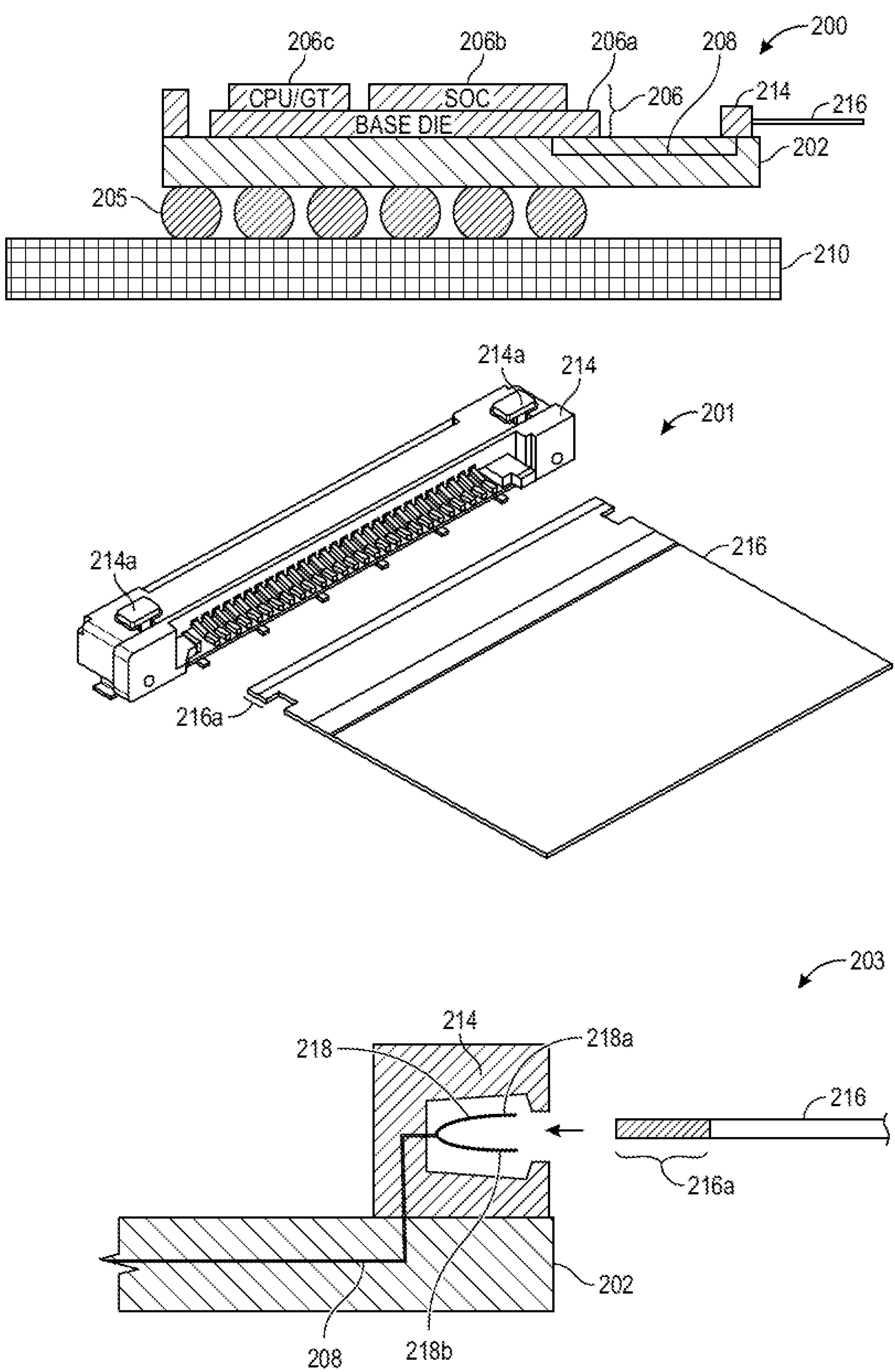
FIG. 2 shows cross section side views and a perspective view of a connector that may be coupled with a ribbon cable, in accordance with various embodiments.

FIG. 2 shows cross section side views and a perspective view of a connector that may be coupled with a ribbon cable, in accordance with various embodiments. Package 200, which may be similar to legacy package 100, shows an embodiment that includes a substrate 202 that has a die complex 206 attached, which may be similar to die complex 106 of FIG. 1, that includes a base die 206*a*, a SOC 206*b*, and a CPU 206*c*, which may be similar to base die 106*a*, a SOC 106*b*, and a CPU 106*c* of FIG. 1.

In embodiments, a connector 214 may be physically coupled with the substrate 202 and electrically coupled with the die complex 206 using electrical routings 208, which may be similar to electrical routings 108 of FIG. 1. A ribbon cable 216 may be coupled with the connector 214, with the ribbon cable 216 connected to some other device (not shown). In embodiments, the substrate 202 may be coupled to a PCB 210 using BGA 205.

Diagram 201 shows a perspective view of a connector 214, and a ribbon cable 216 about to be inserted into the connector 214. A ribbon connector contact area 216*a* will couple the individual cables with the connector 214. In embodiments, locks 214*a* within the connector 214 may be used to secure the ribbon cable 216 into the connector 214.

Diagram 203 shows a cross section side view of a portion of substrate 202, with connector 214 physically and electrically coupled with the substrate 202 using electrical routings 208. In embodiments, the ribbon connector contact area 216*a* of the ribbon cable 216 will be inserted into the connector 214 and will come into contact with a row of electrical contacts 218, which may have an upper array of contacts 218*a* and a lower array of contacts 218*b* for each of the wires in the ribbon cable 216. In embodiments, once the ribbon cable 216 is inserted, the upper array of contacts 218*a* and the lower array of contacts 218_b_ may close, or clamp down, to secure electrical contact, respectively, between the each of the array of electrical contacts 218 and the individual wires in the ribbon connector contact area 216_a_.

Figure 3:
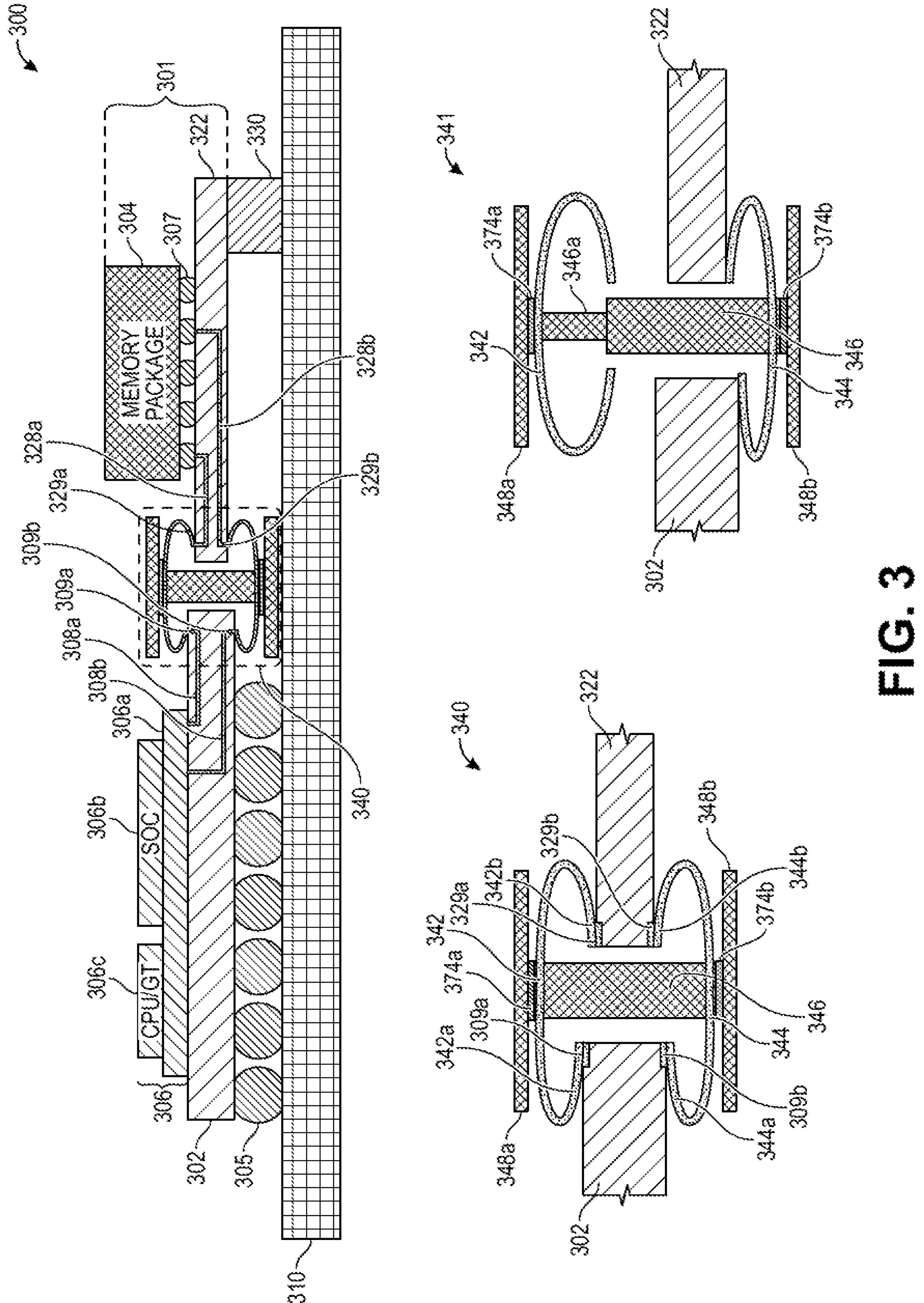
FIG. 3 shows a cross section side view of a substrate that includes a die complex that is coupled with another substrate that includes a memory die using a connector, in accordance with various embodiments.

FIG. 3 shows a cross section side view of a substrate that includes a die complex that is coupled with another substrate that includes a memory die using a connector bridge, in accordance with various embodiments. System 300 shows a substrate 302 that has a die complex 306 coupled with the substrate 302. The die complex 306 may include a base die 306_a_, a SOC 306_b_, and a CPU 306_c_.

The substrate 302 may be coupled to a PCB 310 using a BGA 305. In embodiments, substrate 302, die complex 306, and PCB 310 may be similar to substrate 202, die complex 206, and PCB 210 of FIG. 2. In embodiments, a first series of electrical routings 308_a_ may electrically couple the die complex 306 with a top array of electrical contacts 309_a_ on the top side of the substrate 302, and a second series of electrical routings 308_b_ may electrically couple the die complex 306 with a bottom array of electrical contacts 309_b_ on the bottom side of the substrate 302.

A modular memory 301 may include a substrate 322 and a memory package 304 that may be electrically and physically coupled with the substrate 322 using BGA 307. In embodiments, a third series of electrical routings 328_a_ may electrically couple the memory package 304 with an array of top electrical contacts 329_a_ on the top side of the substrate 322, and a second series of electrical routings 328_b_ may electrically couple memory package 304 with an array of bottom electrical contacts 329_b_ on the bottom side of the substrate 322.

In embodiments, the substrate 322 may be fabricated using different types of technology, for example a standard high-density interconnect (HDI) substrate, an embedded trace substrate (ETS), a prepeg substrate, a modified semi-additive high-density interconnect PGB (MSAP), a high-density interconnect PCB with bind, buried, or microvia technology, a substrate like a PCB, or a type 4 PCB.

Connector 340 may electrically and physically couple the substrate 302 with the substrate 322, and thereby electrically couple the memory package 304 with the die complex 306. In embodiments, a support 330 may be attached to the PCB 310, and may provide cushioning and/or mechanical support for the substrate 322 when it is coupled with substrate 302 using the connector 340. In embodiments, discussed further below, the support 330 may include multiple supports, and may have different configurations.

Connector 340 may include a top plurality of leads 342, each with a first end 342_a_ that may come into physical and electrical contact, respectively, with the top array of electrical contacts 309_a_ on substrate 302, and each with a second end 342_b_ that may come into physical and electrical contact, respectively, with the array of contacts 329_a_ on substrate 322. In embodiments, at least some of the top plurality of leads 342 may be electrically isolated from each other. Connector 340 may also include a bottom plurality of leads 344, each with a first end 344_a_ that may come into physical and electrical contact, respectively, with the bottom array of contacts 309_b_ on substrate 302, and each with a second end 344_b_ that may come into physical and electrical contact, respectively with the array of bottom electrical contacts 329_b_ on substrate 322. In embodiments, at least some of the bottom plurality of leads 344 may be electrically isolated from each other.

The configuration of the top plurality of leads 342 and the bottom plurality of leads 344 may be designed based upon various factors, including but not limited to the location and dimension of the array of electrical contacts 309_a_, 309_b_, 329_a_, 329_b_, and a thickness of the substrates 302, 322. For example, as shown, substrate 322 may be thinner than substrate 302.

In embodiments, the top plurality of leads 342 may be coupled with a support beam 374_a_ and the bottom plurality of leads 344 may be physically coupled with a support beam 374_b_. In embodiments, the support beams 374_a_, 374_b_ may be made of a thermo-plastic material and may be non-electrically conductive and may be an insulator. In embodiments, the support beam 374_a_ may be used to maintain a separation distance and an orientation, respectively, of each of the top plurality of leads 342. In embodiments, the support beam 374_b_ may be used to maintain a separation distance and an orientation, respectively, of each of the bottom plurality of leads 344.

In embodiments, the support beam 374_a_ and the support beam 374_b_ may be physically coupled using a connector support 346, which may include a telescoping mechanism as discussed further below. In embodiments, a top cover 348_a_ may be proximate to the top plurality leads 342, and a bottom cover 348_b_ may be proximate to the bottom plurality of leads 344. In some embodiments, as discussed further below, the top cover 348_a_ and the bottom cover 348_b_ may include metal shielding (not shown), which may be coupled to at least some of the top plurality of leads 342 or the bottom plurality of leads 344.

Diagram 341, which may be similar to connector 340, shows a connector support 346 that mechanically couples with the support beam 374_a_ and the support beam 374_b_, where the connector support 346 includes an additional piece 346_a_ that is movably coupled with the connector support 346 so that the top cover 348_a_ may be moved away from the bottom cover 348_b_, and therefore separate the top plurality of leads 342 from the bottom plurality of leads 344. This configuration facilitates the electrical coupling and uncoupling of the substrate 302 and the substrate 322. In embodiments, the connector support 346 may be part of a first sliding component, and the additional piece 346_a_ may be a second sliding component, where the connector support 346 and the additional piece 346_a_ may be referred to as a slider. In embodiments, the additional piece 346_a_ inserts into the connector support 346.

In embodiments, the connector support 346 and the additional piece 346_a_ fixes an X-Y orientation of the top plurality of leads 342 and the bottom plurality of leads 344 with respect to a surface of the substrate 302 or a surface of the substrate 322. In embodiments, the connector support 346 may be configured to vary a distance between the top plurality of leads 342 in the bottom plurality of leads 344.

Figure 4:
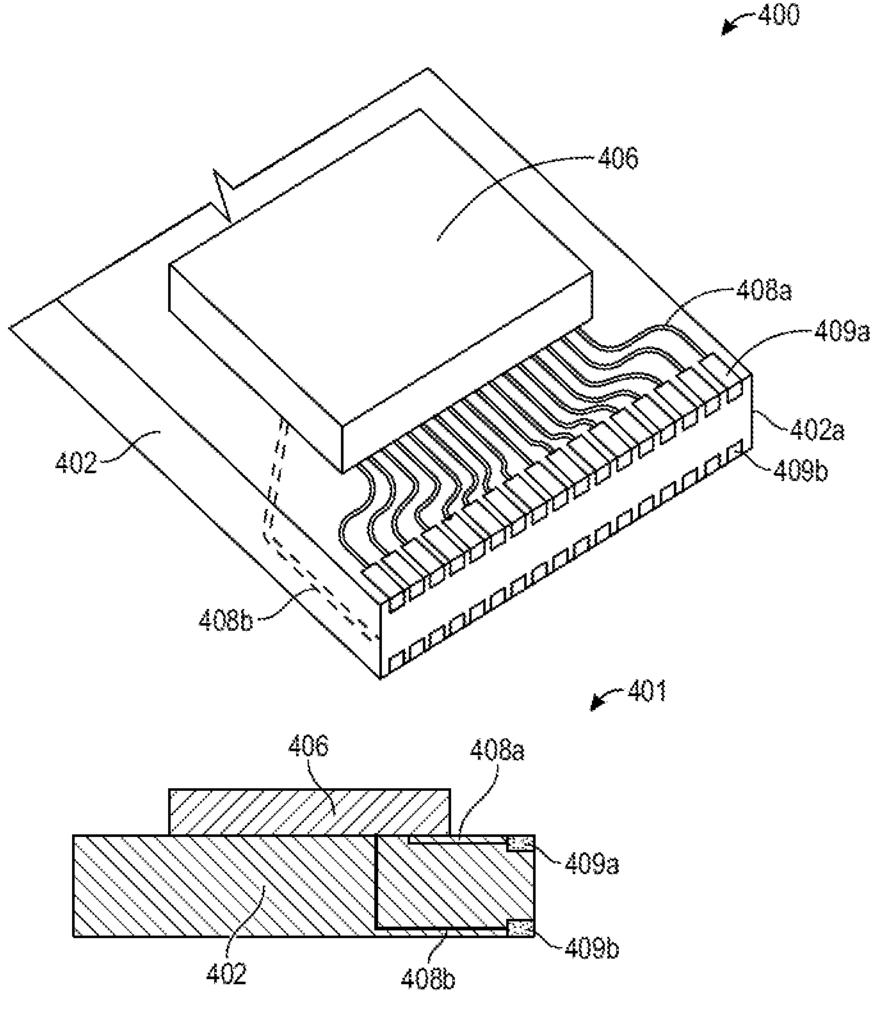
FIG. 4 shows a perspective view and a cross section side view of an edge of a substrate to be coupled using a connector, in accordance with various embodiments.

FIG. 4 shows a perspective view and a cross section side view of an edge of a substrate to be coupled using a connector, in accordance with various embodiments. Diagram 400 shows a perspective view of a substrate 402 that has a die complex 406 attached to a top of the substrate 402, with an edge 402_a_ of the substrate 402 that includes a top array of contacts 409_a_ at the top of the substrate 402 and a bottom array of contacts 409_b_ at the bottom of the substrate 402. In embodiments, the electrical routings 408_a_ electrically couple with the top array of contacts 409_a_ and with the die complex 406, and the electrical routings 408_b_ electrically couple with the bottom array of contacts 409_b_ and with the die complex 406.

In embodiments, the substrate 402, die complex 406, top array of contacts 409_a_, bottom array of contacts 409_b_, and electrical routings 408_a_, 408_b_ may be similar to substrate 302, die complex 306, top array of electrical contacts 309_a_, bottom array of electrical contacts 309*b*, and electrical routings 308*a*, 308*b* of FIG. 3. In embodiments, the substrate 402, die complex 406, top array of contacts 409*a*, bottom array of contacts 409*b*, and electrical routings 408*a*, 408*b* may be similar to substrate 322, memory package 304, top array of electrical contacts 329*a*, bottom array of electrical contacts 329*b*, and electrical routings 328*a*, 328*b* of FIG. 3. Diagram 401 shows a cross section side view of the components described above.

Figure 5:
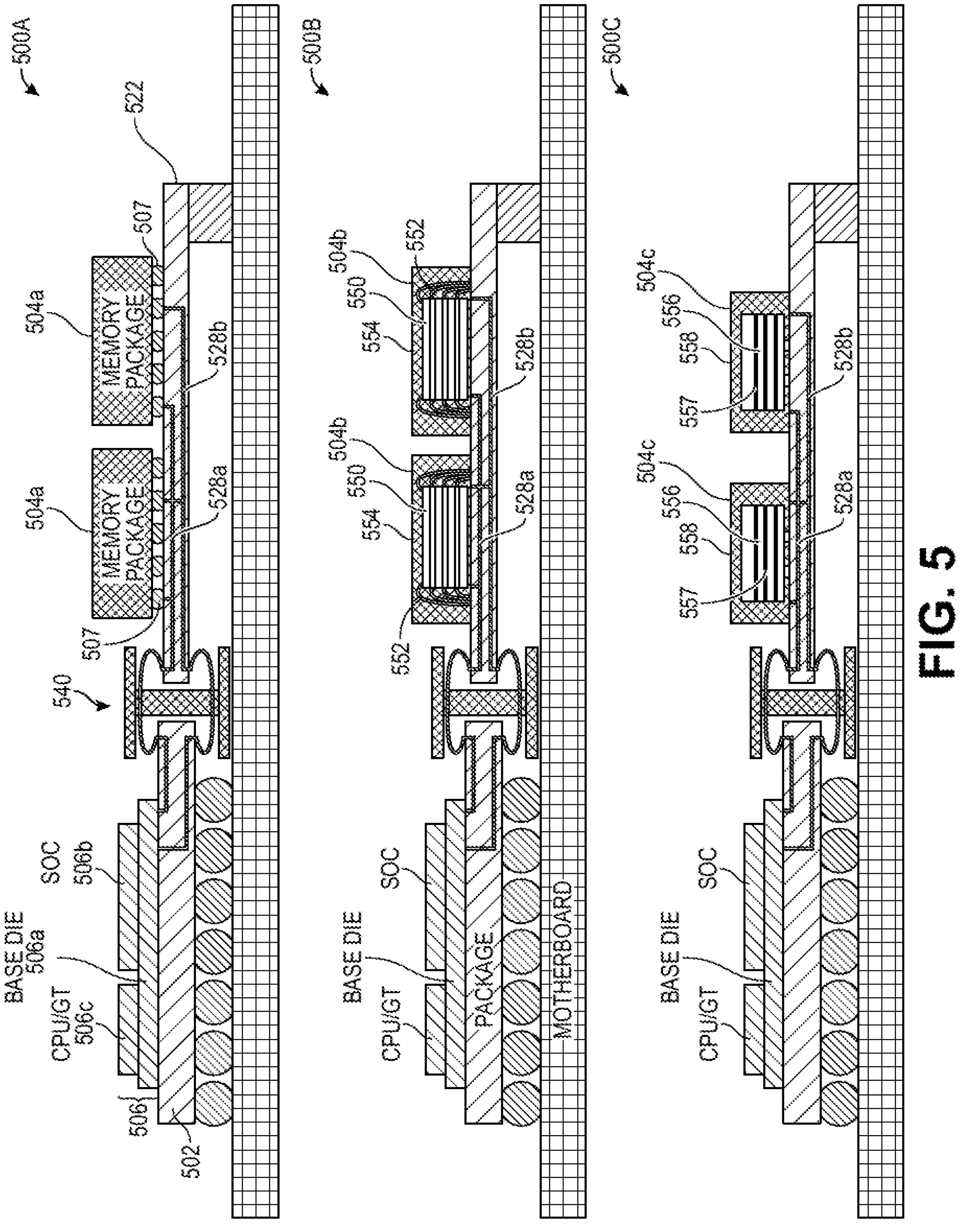
FIG. 5 illustrates side views of a system that includes a first substrate with a die complex that is coupled using a connector with a second substrate that has different types of memory modules, in accordance with various embodiments.

FIG. 5 illustrates side views of a system that includes a first substrate with a die complex that is coupled using a connector with a second substrate that has different types of memory modules, in accordance with various embodiments. System 500A, which may be similar to system 300 of FIG. 3, includes a substrate 502 that has a die complex 506 coupled with a top of the substrate 502, where the die complex 506 may include a base die 506*a*, a SOC 506*b*, and a CPU 506*c*. The substrate 502 is electrically and physically coupled with substrate 522 using connector 540. In embodiments, electrical routings 528*a*, 528*b* may be included in the substrate 522. Substrate 502, die complex 506, substrate 522, connector 540, and electrical routings 528*a*, 528*b* may be similar to substrate 302, die complex 306, substrate 322, connector 340, and electrical routings 528*a*, 528*b* of FIG. 3.

System 500A shows two memory packages 504*a* that are physically coupled to the substrate 522 and electrically coupled with the electrical routings 528*a*, 528*b* using BGA 507, which may be similar to BGA 307 of FIG. 3. System 500B, which may be similar to system 500A, shows two memory components 504*b* that are physically coupled to the substrate 522 and electrically coupled with the electrical routings 528*a*, 528*b*. In the system of 500B, memory components 504*b* may be dynamic random access memory (DRAM) modules that have DRAMs 550 that are electrically coupled with the electrical routings 528*a*, 528*b* using wire bonds 552. In embodiments, the DRAMs 550 and the wire bonds 552 may be encapsulated in a molding 554.

System 500C, which may be similar to system 500A or system 500B, has memory 504*c* that includes DRAM modules 556 that are coupled using through silicon vias within layers 557 to each other and to the electrical routings 528*a*, 528*b*. The DRAM modules 556 may be encapsulated within a molding 558.

Figure 6:
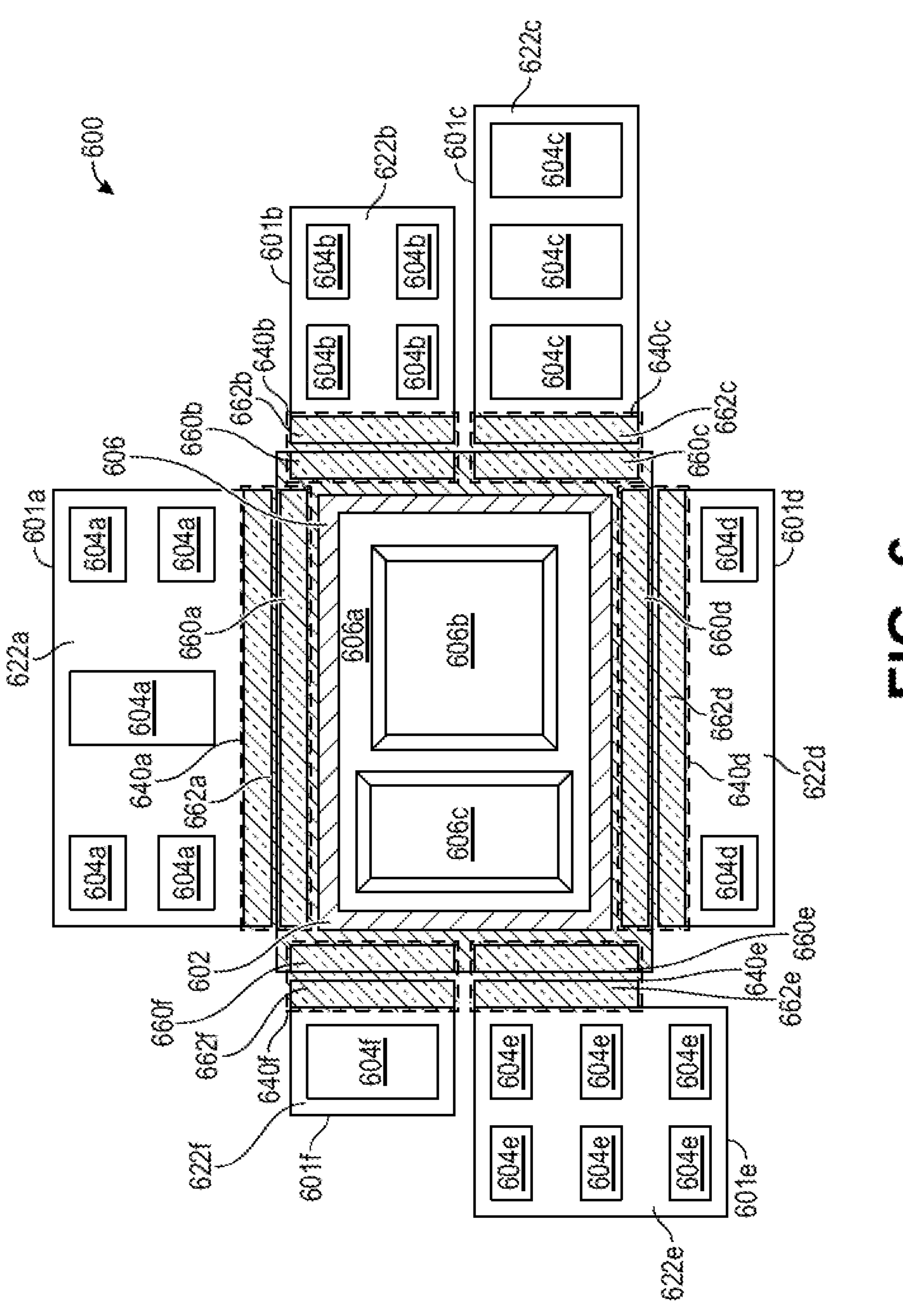
FIG. 6 shows a top-down view of a substrate with a die complex that is coupled with multiple substrates that include memory dies using multiple connectors, in accordance with various embodiments.

FIG. 6 shows a top-down view of a substrate with a die complex that is coupled with multiple substrates that include memory dies using multiple connectors, in accordance with various embodiments. System 600 shows a top-down view of a substrate 602 that includes a die complex 606 with a base die 606*a*, a SOC 606*b*, and a CPU 606*c* which may be similar to substrate 302 that includes die complex 306 with a base die 306*a*, SOC 306*b*, and CPU 306*c* of FIG. 3.

In embodiments, array of contacts 660*a*-660*f* are on a surface of the substrate 602, and along the edge of the substrate surrounding the die complex 606. In embodiments, the array of contacts 660*a*-660*f* may be similar to top array of contacts 309*a* of FIG. 3. In embodiments, one or more of each contact within each of the array of contacts 660*a*-660*f* may be electrically coupled with the die complex 606. In embodiments, modular memory 601*a*-601*f*, which may be similar to modular memory 301 of FIG. 3 may be coupled with the substrate 602. In embodiments, each modular memory 601*a*-601*f*, respectively includes a substrate 622*a*-622*f*, one or more memory packages 604*a*-604*f*, and an array of contacts 662*a*-662*f*.

In embodiments, each of the array of contacts 660*a*-660*f*, respectively, may be electrically coupled with each of the array of contacts 662*a*-662*f* by a connector 640*a*-640*f*, which may be similar to connector 340 of FIG. 3.

Figure 7:
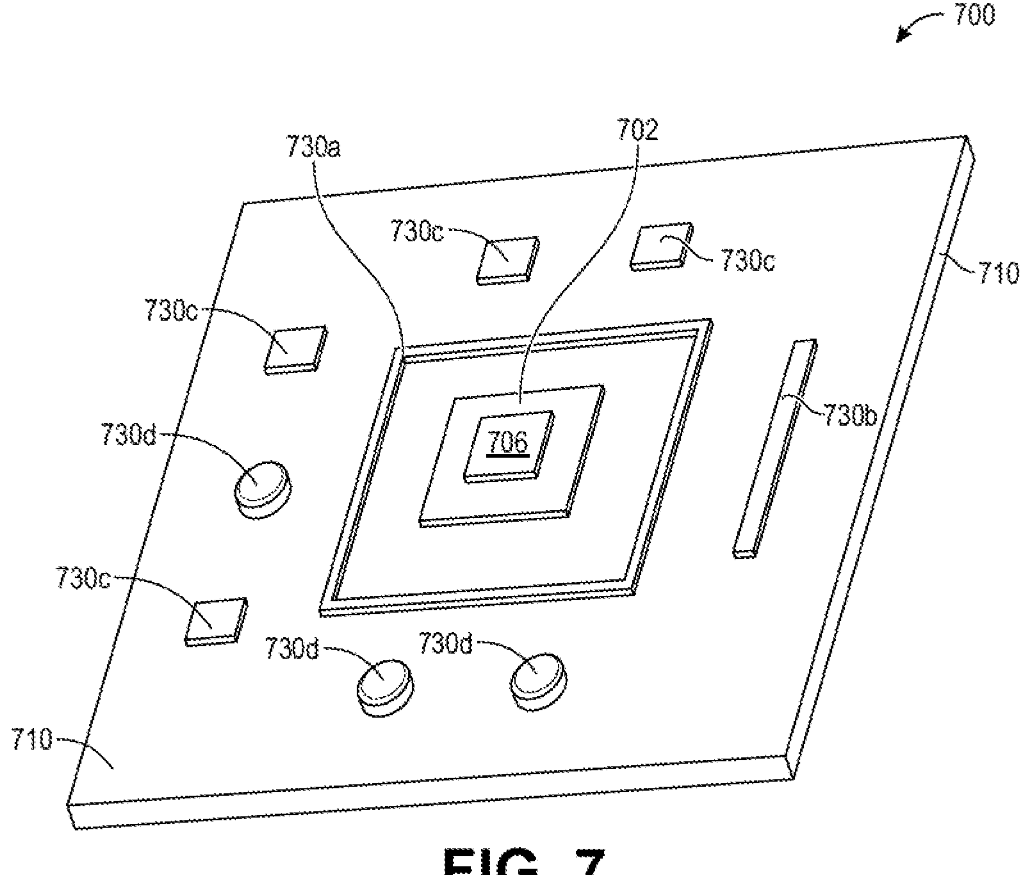
FIG. 7 illustrates a perspective view of a motherboard that includes multiple support features for supporting multiple substrates that include memory dies, in accordance with various embodiments.

FIG. 7 illustrates a perspective view of a motherboard that includes multiple support features for supporting multiple substrates that include memory dies, in accordance with various embodiments. Diagram 700 may include PCB 710, which may be similar to PCB 310 of FIG. 3, and which may be a substrate, that is coupled with a substrate 702, which may be similar to substrate 302 of FIG. 3. In embodiments, a die complex 706, which may be similar to die complex 306 of FIG. 3, may be coupled with the substrate 702.

In embodiments, supports 730*a*-730*d*, which may be similar to support 330 of FIG. 3, may be on a surface of the PCB 710. In embodiments, the supports 730*a*-730*d* may be used to provide mechanical support to the modular memory, for example modular memory 301 of FIG. 3, or modular memory 601*a*-601*f* of FIG. 6, when coupled with the substrate 702 using a connector such as connector 340 of FIG. 3 or connectors 640*a*-640*f* of FIG. 6.

In embodiments, the supports 730*a*-730*d* may be of any shape, size, or height depending upon a dimension or architecture of the module memory, such as modular memory 301 of FIG. 3, that is to be coupled with the substrate 702. In some embodiments, a support 730*a* may be a continuous wall that surrounds the substrate 702. In other embodiments, a support 730*b* may be a bar that extends along the surface of the PCB 710. In other embodiments, supports 730*c* may be a square or rectangular pedestal, wherein in other embodiments supports 730*d* may be cylindrical. In embodiments the supports 730*a*-730*d* may include an elastomer, silicon rubber, or any materials that provide a cushioning effect. In embodiments, supports 730*a*-730*d* may be attached using a fast cure adhesive.

Figures 8A, 8B, 8C, 8D:
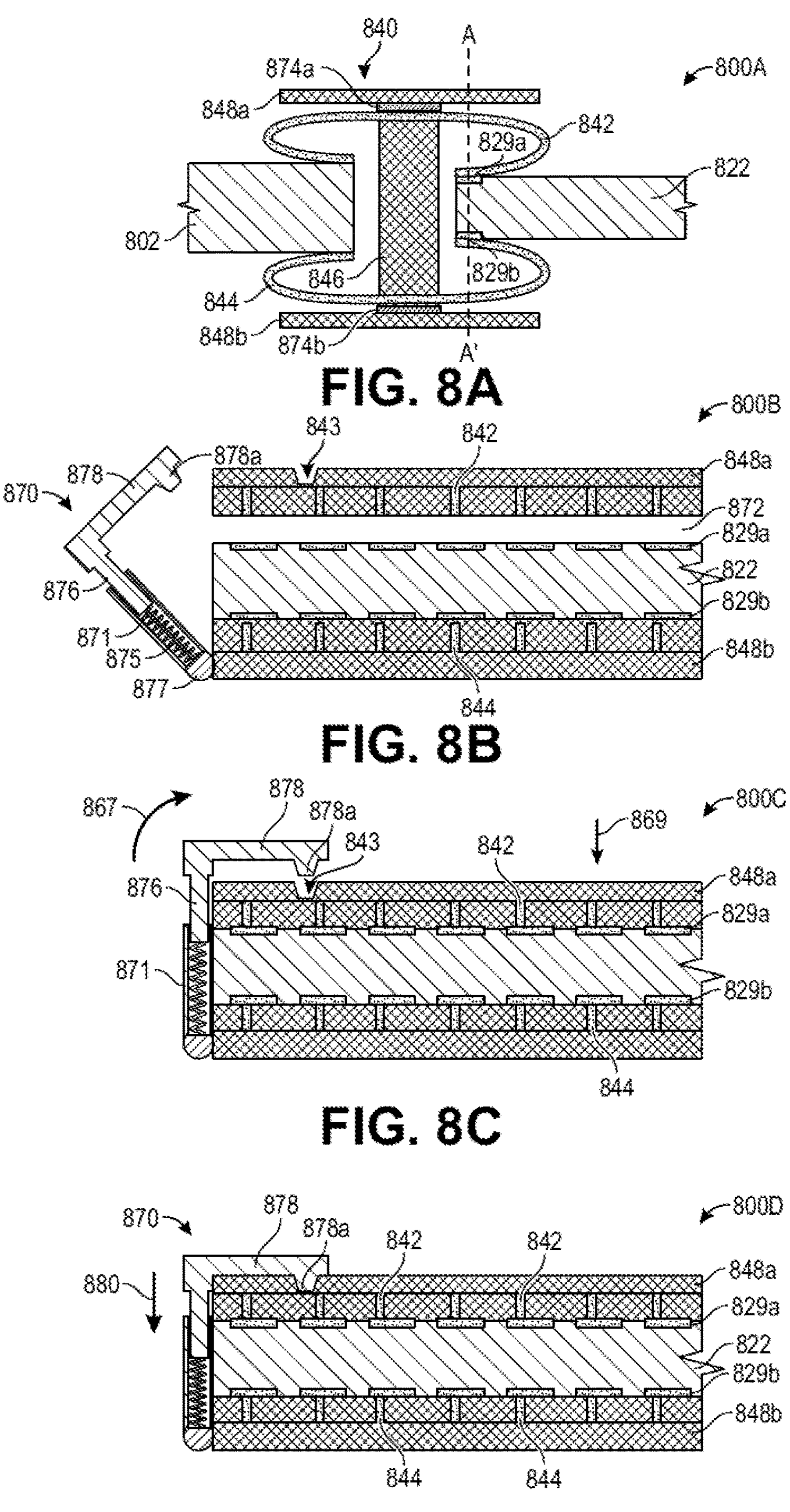
FIGS. 8A-8D illustrate multiple cross section side views of a connector with a locking system, in accordance with various embodiments.

FIGS. 8A-8D illustrate multiple cross section side views of a connector with a locking system, in accordance with various embodiments. Diagram 800A of FIG. 8A shows a cross section end view of a connector 840, which may be similar to connector 340 of FIG. 3, with a top plurality of leads 842 coupled with support beam 874*a* and a bottom plurality of leads 844 coupled with support beam 874*b*. Top plurality of leads 842, bottom plurality of leads 844, and support beams 874*a*, 874*b* may be similar to top plurality of leads 342, bottom plurality of leads 344, and support beams 374*a*, 374*b* of FIG. 3.

The support beams 874*a*, 874*b* may be coupled to each other using connector support 846, which may be similar to connector support 346 of FIG. 3. The top plurality of leads 842 are coupled, respectively, to an array of contacts 829*a* on a top surface of substrate 822, and the bottom plurality leads 844 are coupled, respectively to an array of contacts 829*b* on a bottom surface of substrate 822. A top cover 848*a* and a bottom cover 848*b* may be mechanically coupled, respectively, to the support beam 874*a* and support beam 874*b*. In embodiments, the connector support 846 may be a telescoping support.

Diagrams 800B of FIG. 8B, 800C of FIG. 8C, and 800D of FIG. 8D are partial cross section side views along A-A' of diagram 800A of FIG. 8A. Diagram 800B shows a partial cross section side view along A-A' where the connector 840 is not yet attached to the substrate 822, as shown by gap 872. In embodiments, the top cover 848*a* includes a notch 843. A latch 870 that may be used to secure the top cover 848*a* and the bottom cover 848*b* in order to secure the top plurality leads 842 and the bottom plurality leads 844 to the substrate 822.

In embodiments, the latch 870 may include an attachment 877 that may be coupled with the bottom cover 848*b*. In embodiments, the attachment 877 may rotate. The attachment 877 may be coupled with a housing 871 into which a spring 875 is attached. An upper part 876 may fit within the housing 871 and may be attached to the spring 875. In embodiments, the spring 875 may exert a pulling force against the upper part 876. A latch cover 878 that includes a point 878*a* that may be physically coupled with the upper part 876. In embodiments, the point 878*a* may fit into the notch 843.

Diagram 800C shows a partial cross section side view along A-A' where a force 869 is applied to the top cover 848*a* to push the top plurality leads 842 against the array of contacts 829*a* and the bottom plurality leads 844 against the plurality of contacts 829*b*. The latch 870 that may be rotated in the direction 867 to position the latch cover 878 and the point 878*a* of the latch cover 878 directly above the notch 843.

Diagram 800D shows a partial cross section side view along A-A' where the latch 870 is released and moves in a downward direction 880 to seat the point 878*a* of the latch cover 878 into the notch 843.

The latch 870 as described in FIG. 8B is only one example of a latching mechanism that may be used to secure a connector 840 to substrates 802, 822. Other latching mechanisms, or other methods or techniques used to secure or compress one surface against another, may be used with respect to connector 840.

Figures 9A, 9B:
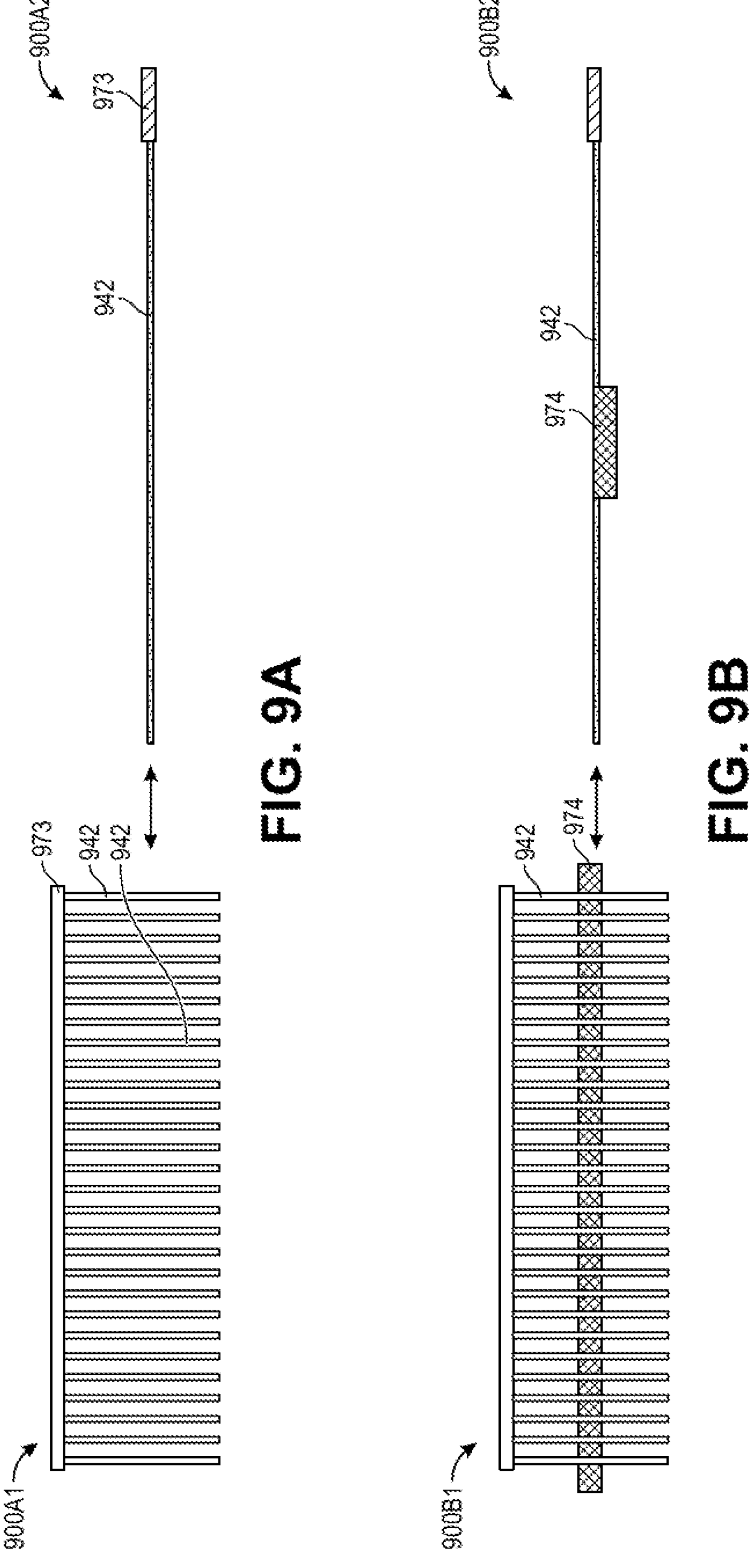
FIGS. 9A-9K illustrate stages in a manufacturing process for creating a connector bridge and a locking mechanism, in accordance with various embodiments.

FIGS. 9A-9K illustrate stages in a manufacturing process for creating a connector bridge and a locking mechanism, in accordance with various embodiments. FIG. 9A shows a top-down view 900A1 and a cross section side view 900A2 of a stage in the manufacturing process where a plurality of leads 942 are provided, which may be similar to the top plurality of leads 342 or the bottom plurality of leads 344 of FIG. 3. In embodiments, the plurality of leads 942 may be physically coupled with a lead holder 973. In embodiments, the plurality of leads 942 and the lead holder 973 may include metal, which may include copper.

In embodiments, the lead holder 973 may help maintain the spacing between each of the plurality of leads 942, and may help maintain each of the plurality of leads 942 in a substantially parallel configuration. In embodiments, a spacing between each of the plurality of leads 942 may be the same as the spacing between a top array of contacts 409*a* or a bottom array of contacts 409*b* of FIG. 4, to ensure a good electrical connection. In embodiments, the lead holder 973 together with the plurality of leads 942 may be referred to as a connector lead frame.

FIG. 9B shows a top-down view 900B1 and a cross section side view 900B2 of a stage in the manufacturing process where a support beam 974 may be coupled with the plurality of leads 942. In embodiments, the support beam 974 may be placed near the center of each of the plurality of leads 942. In embodiments, the support beam 974 may include a thermo-plastic, or may include some other material that is not electrically conductive. In embodiments, support beam 974 may be similar to support beams 374*a*, 374*b* of FIG. 3, or support beams 874*a*, 874*b* of FIG. 8.

Figures 9C, 9D:
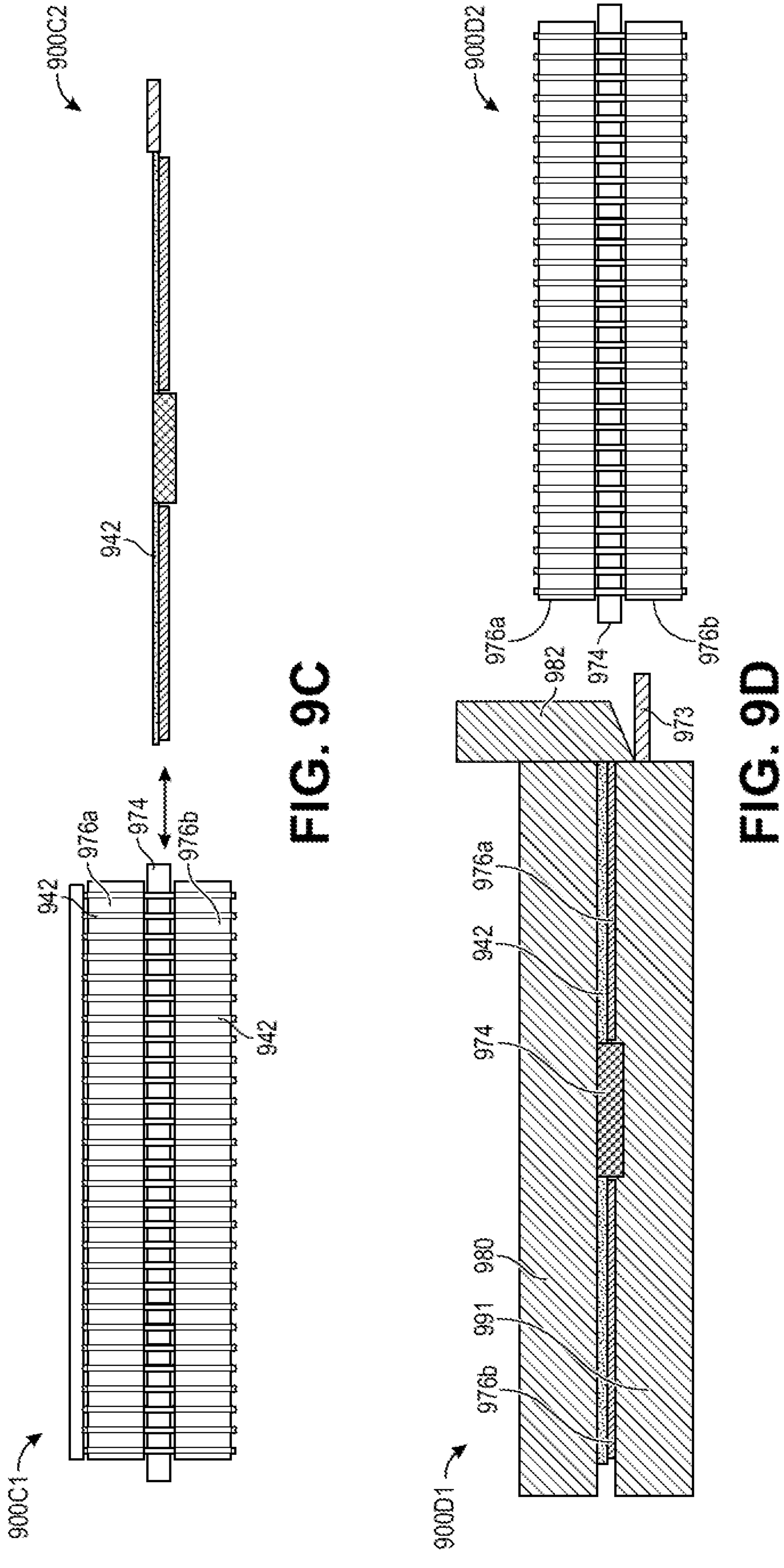

FIG. 9C shows a top-down view 900C1 and a cross section side view 900C2 of a stage in the manufacturing process where protection tape 976*a*, 976*b* may be applied to a side of the plurality of leads 942. In embodiments, a single strip or a plurality of strips may be used. In embodiments, the protection tape 976*a*, 976*b* protects the plurality leads 942 and prevents the plurality leads 942 from shifting, lifting, or otherwise being damaged during subsequent stages of the manufacturing process. In embodiments, the protection tape 976*a*, 976*b* may provide temporary protection, and may include a polyimide film base protective tape.

FIG. 9D shows a cross-section end view 900D1 of a stage in the manufacturing process where the support beam 974, plurality of leads 942 and the protection tape 976*a*, 976*b* that are secured by a first support 991 and a second support 980, while a trimmer 982 is used to cut off the lead holder 973. In embodiments, the first support 991, the second support 980, and the trimmer 982 may be made of a metal material. Top-down view 900D2 shows the result after trimming off the lead holder 973, where each of the plurality of leads 942 are secured by the protection tape 976*a*, 976*b* and the support beam 974.

Figure 9E:
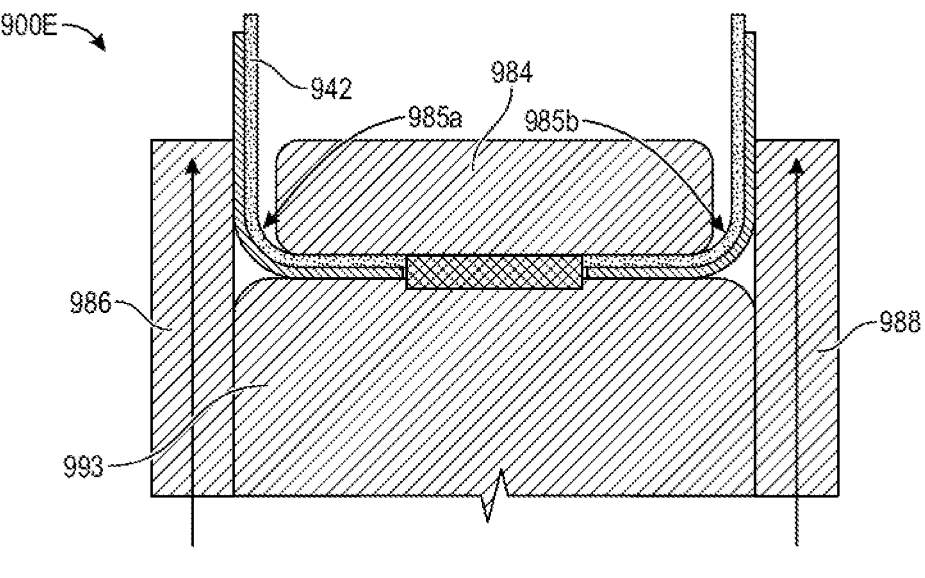

FIG. 9E shows a cross-section end view 900E of a stage in the manufacturing process where a bottom support 993 and a top support 984 may secure the plurality of leads 942, the protection tape 976*a*, 976*b*, and the support beam 974. In embodiments, the bottom support 993 and the top support 984 may be made of a material that includes metal. In embodiments, a left support 986 and a right support 988 may be moved upwards as shown to cause a first bend 985*a* that creates a first portion of the plurality of leads 942 and a second bend 985*b* in the plurality leads 942 that creates a second portion of the plurality of leads 942. In embodiments, a thickness of the top support 984, or a length of the left support 986 or the right support 988, may be adjusted to adjust the geometry of the first bend 985*a* or the second bend 985*b*. The geometry may be adjusted, for example, if the resulting connector, such as connector 340, is to couple to substrates of different thickness, for example substrate 302 and substrate 322 of FIG. 3.

Figure 9F:
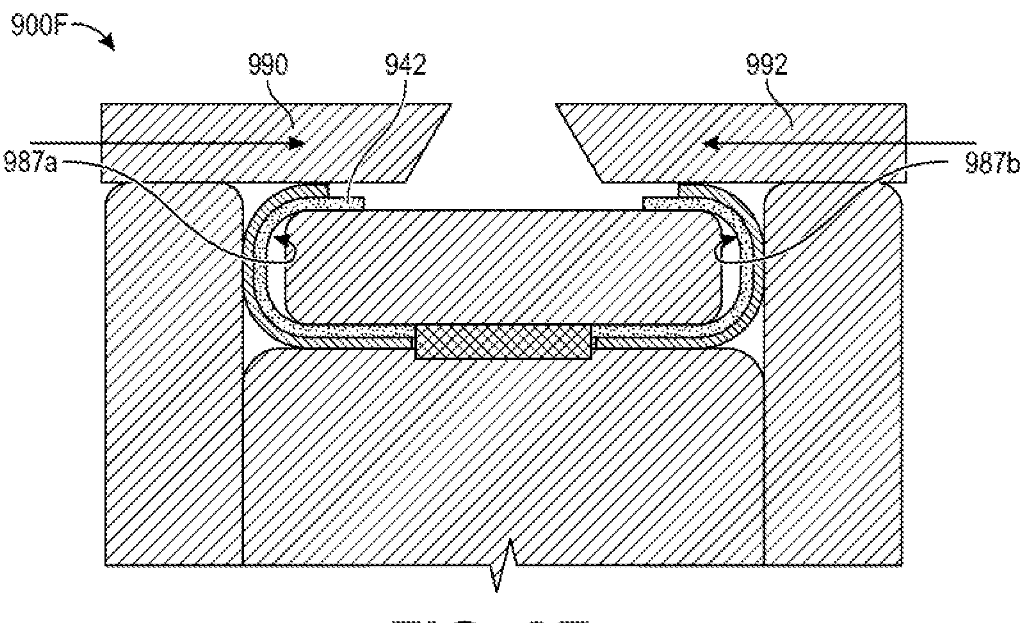

FIG. 9F shows a cross-section end view 900F of a stage in the manufacturing process where a first sliding support 990 and a second sliding support 992 are moved inward to cause a third bend 987*a* and a fourth bend 987*b* in the plurality of leads 942.

Figure 9G:
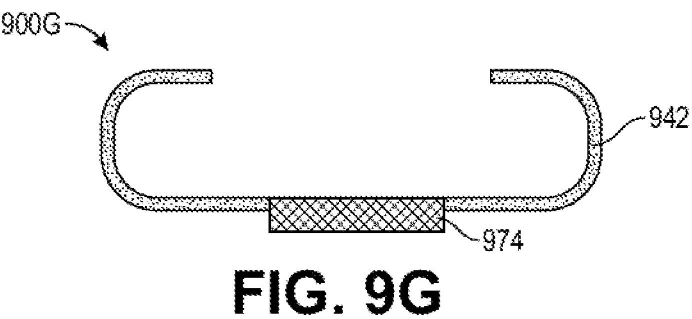

FIG. 9G shows a cross-section end view 900G of a stage in the manufacturing process that shows the plurality of leads 942 with the support beam 974, where the plurality of leads 942 have been bent, and the protection tape 976*a*, 976*b* of FIG. 9C has been removed.

Figure 9H:
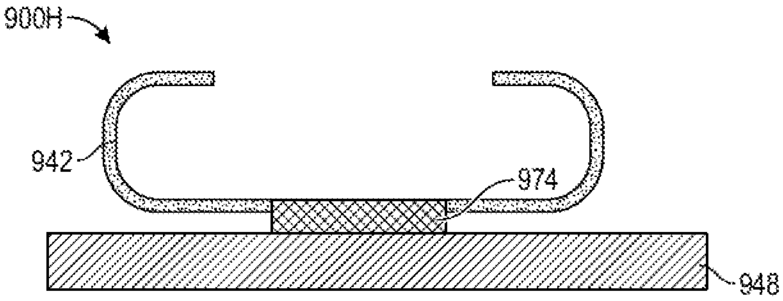

FIG. 9H shows a cross-section end view 900H where a cover 948 may be physically coupled with the support beam 974. In embodiments, the cover 948 may be similar to the top cover 348*a* or bottom cover 348*b* of FIG. 3. In embodiments, the cover 948 may include a thermal-plastic material and, in embodiments, may extend beyond a length of the plurality of leads 942.

Figure 9I:
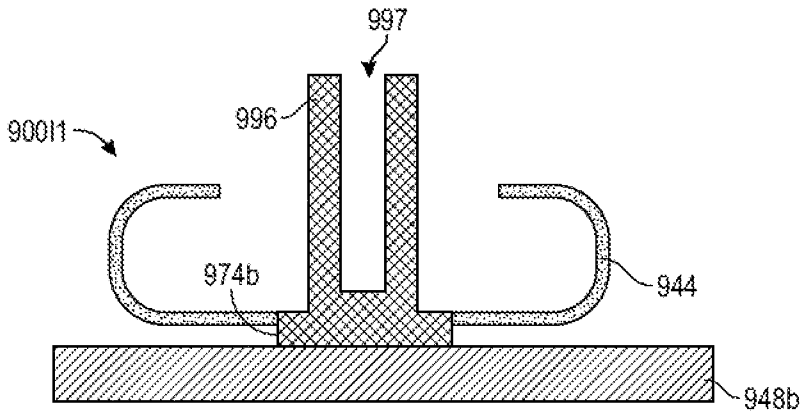
Figure 9I:
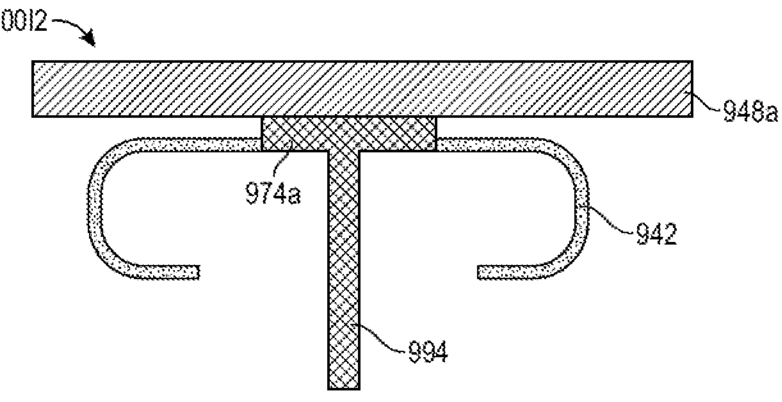

FIG. 9I shows a cross-section end view 90011 of a bottom connector, and a cross-section end view 90012 of a top connector, which may be similar to connector 340 of FIG. 3. Cross-section end view 90011 shows a bottom cover 948*b* to which a support beam 974*b* is attached that includes a bottom plurality of leads 944, which may be similar to leads 942 of FIG. 9H. In embodiments, the bottom cover 948*b*, the support beam 974*b*, and the bottom plurality of leads 944 may be similar to bottom cover 348*b*, support beam 374*b*, and bottom plurality of leads 344 of FIG. 3. A bottom slider 996, which may include a center cavity 997, may be coupled with the support beam 974*b*. In embodiments, the bottom slider 996 may be made from a thermo-plastic material.

Cross-section end view 90012 shows a top cover 948*a* to which a support beam 974*a* is attached that includes a top plurality of leads 942. In embodiments, the top cover 948*a*, the support beam 974*a*, and the top plurality of leads 942 may be similar to cover 948 of FIG. 9H, top cover 348*a* of FIG. 3, support beam 374*a* and top plurality of leads 342 of FIG. 3. A top slider 994 may be coupled with the support beam 974*a*. In embodiments, the top slider 994 may be made from a thermo-plastic material. In embodiments, the top slider 994 and the bottom slider 996 together may be similar to the connector support 346 of FIG. 3.

Figure 9J:
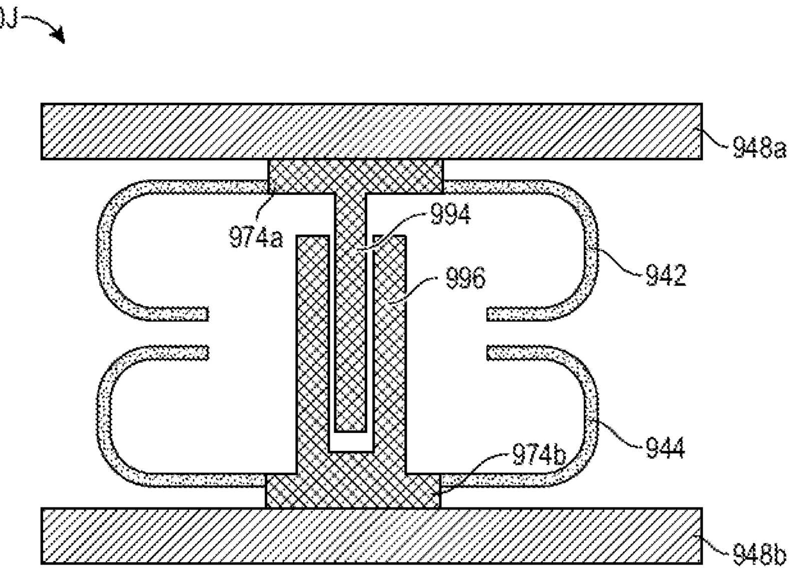

FIG. 9J shows a cross section end view 900J that shows a combination of cross-section end views 90011 and 90012. The top slider 994, to which the top support beam 974*a*, the top plurality of leads 942, and the top cover 948*a* are attached, is inserted into the bottom slider 996, to which the bottom support beam 974*b*, the bottom plurality of leads 944, and the bottom cover 948*b* are attached. In embodiments, a distance between the top plurality of leads 942 and the bottom plurality of leads 944 may be adjusted by moving the distance between the top cover 948*a* and the bottom cover 948*b*.

Figure 9K:
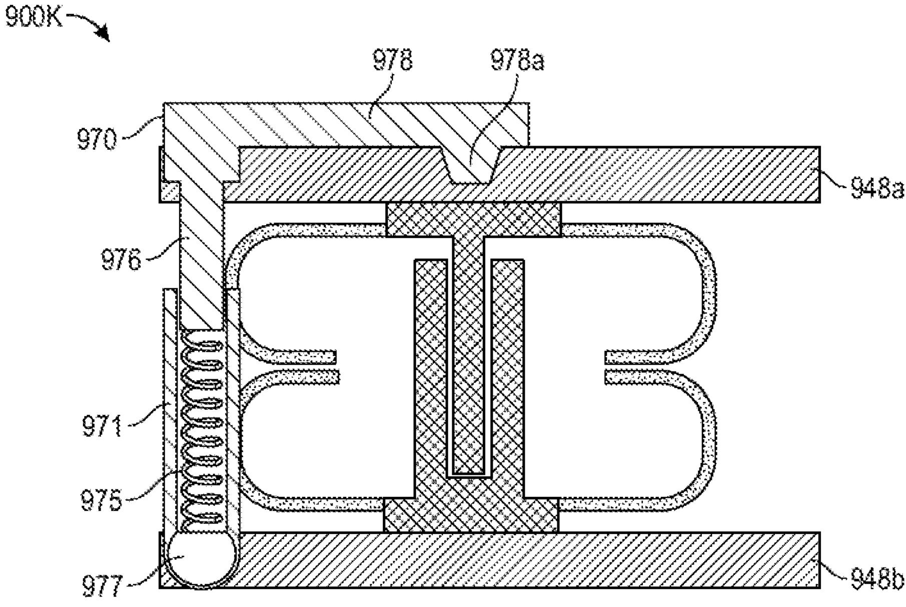

FIG. 9K shows a cross-section end view 900K with locking mechanism 970, which may be similar to the latch 870 of FIG. 8. In embodiments, the locking mechanism 970 may include an attachment 977 that may be coupled with the bottom cover 948*b*. The attachment 977 may be coupled with a housing 971 into which a spring 975 is attached. An upper part 976 may fit within the housing 971 and be attached to the spring 975. In embodiments, the spring 975 may exert a pulling force against the upper part 976. A latch cover 978 that includes a point 978*a* that may be physically coupled with the upper part 976 and extend into the top cover 948*a*.

Figure 10A:
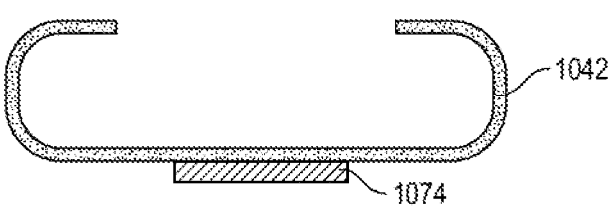
FIGS. 10A-10J illustrate stages in a manufacturing process for creating a connector that includes a metal shield, in accordance with various embodiments.

FIGS. 10A-10J illustrate stages in a manufacturing process for creating a connector that includes a metal shield, in accordance with various embodiments. FIG. 10A illustrates a cross-section end view of a stage in a manufacturing process, where a plurality of leads 1042 that are connected with a support beam 1074, which may be similar to a plurality of leads 942 that are connected with a support beam 974 of FIG. 9G. In embodiments, the plurality of leads 1042 have been bent using a process similar to the process described with respect to FIGS. 9A-9F.

Figure 10B:
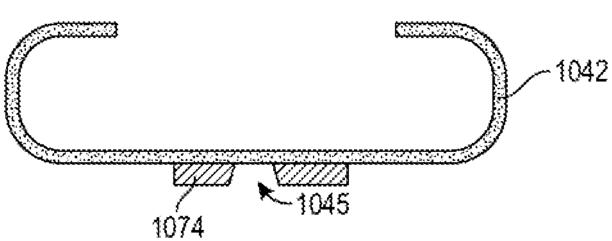

FIG. 10B illustrates a cross-section end view of a stage in a manufacturing process, where a cavity 1045 is formed into the support beam 1074 to expose a portion of the plurality of leads 1042. In embodiments, the cavity 1045 may be formed using laser drilling or using some other technique to remove a portion of the support beam 1074.

Figure 10C:
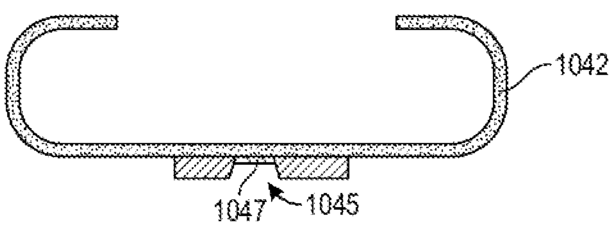

FIG. 10C illustrates a cross-section end view of a stage in the manufacturing process where a solder 1047 may be applied into the cavity 1045 of FIG. 10B. In embodiments, the solder 1047 may be an electrically conductive adhesive filling.

Figure 10D:
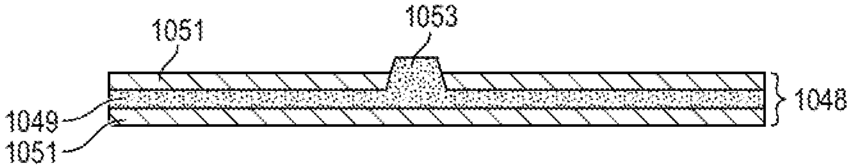

FIG. 10D illustrates a cross-section end view of a stage in the manufacturing process where a cover 1048 is provided, where the cover 1048 includes an electrically conductive metal shield 1049 embedded within an electrically insulated material 1051. In embodiments, the cover 1048 may be similar to cover 948 of FIG. 9H. In embodiments, the electrically insulated material 1051 may include a thermoplastic material, and the metal shield 1049 may be a copper metal shield. In embodiments, the metal shield 1049 may be a planar surface, or may be a solid or a mesh plane that may be electrically coupled (not shown) with Vss, with a signal, or with power. An electrical connector 1053 may be electrically coupled with the metal shield 1049 and may be at or above a surface of the cover 1048. In embodiments the electrical connector 1053, which may be referred to as an electrical connection, or the metal shield 1049 may be referred to as electrical features.

Figure 10E:
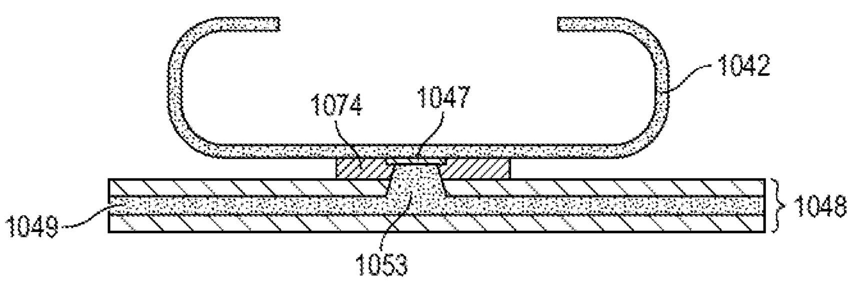

FIG. 10E illustrates a cross-section end view of a stage in a manufacturing process where the cover 1048, including the electrical connector 1053, is inserted into the support beam 1074 and electrically coupled with the solder 1047, which is electrically coupled with at least one of the plurality of leads 1042. In this way, one or more of the plurality of leads 1042 may be at a same electrical potential as the metal shield 1049.

Figure 10F:
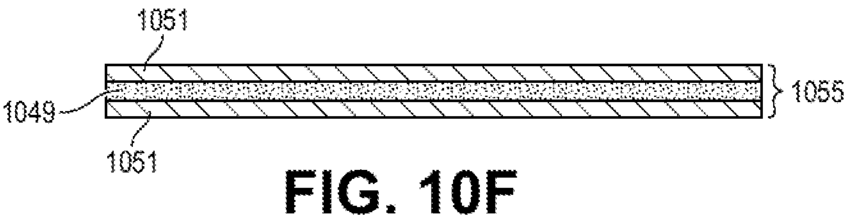

FIG. 10F illustrates a cross-section end view of a stage in a manufacturing process where a cover 1055 is provided that includes a metal shield 1049 that is surrounded by an electrically insulated material 1051. In embodiments, the cover 1055 may be similar to cover 948 of FIG. 9H.

Figure 10G:
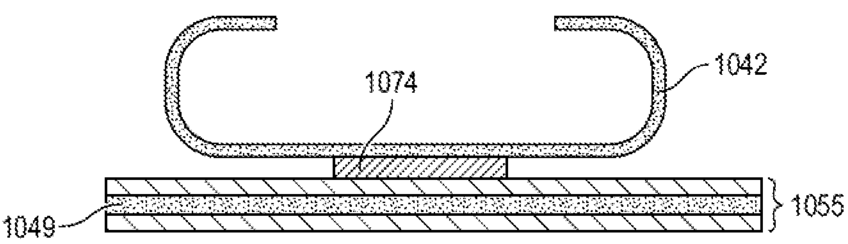

FIG. 10G illustrates a cross-section end view of a stage in a manufacturing process where a support beam 1074 that is coupled with a plurality of leads 1042 is attached to a side of the cover 1055. In embodiments, none of the plurality of leads 1042 are electrically coupled with the metal shield 1049.

Figure 10H:
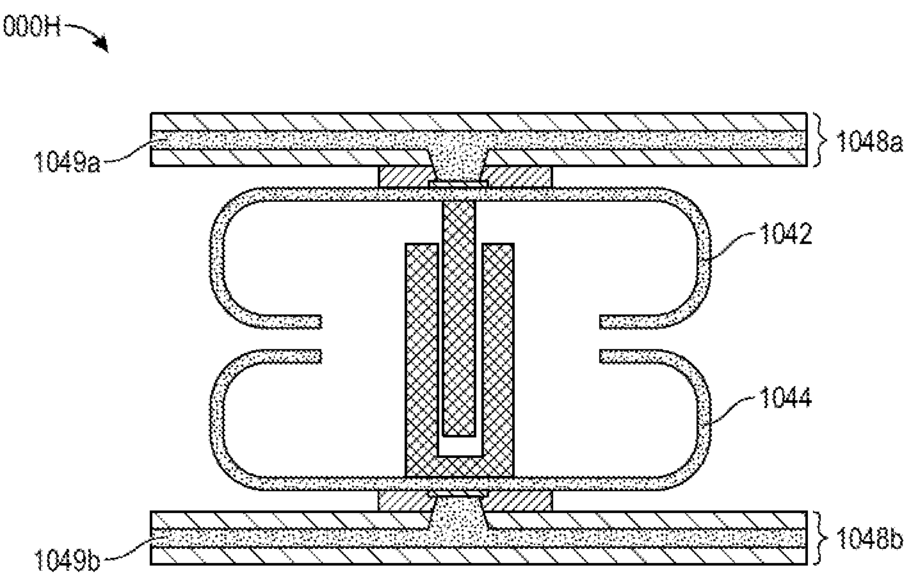

FIG. 10H illustrates a cross-section end view of a stage in the manufacturing process for a connector 1000H that includes a top cover 1048*a* with a metal shield 1049*a*, which may be similar to cover 1048 and metal shield 1049, that is electrically coupled with at least one of a top plurality of leads 1042. A bottom cover 1048*b* with a metal shield 1049*b*, which may be similar to cover 1048 and metal shield 1049, is electrically coupled with at least one of the bottom plurality of leads 1044. In embodiments, if the metal shield 1049*a* and the metal shield 1049*b* are at a VSS potential, then one of the top plurality of leads 1042 and one of the bottom plurality of leads 1044 will be at a VSS potential.

Figure 10I:
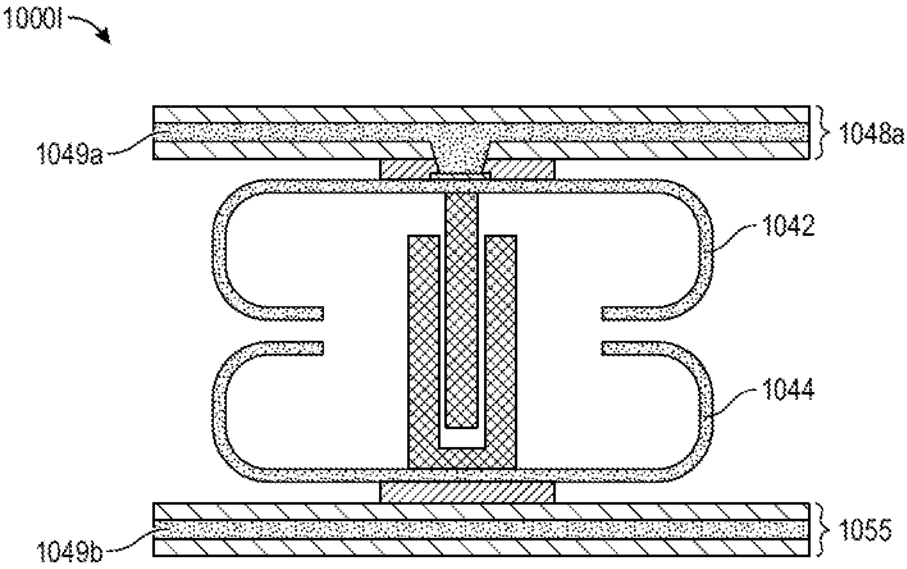

FIG. 10I illustrates a cross-section end view of a stage in the manufacturing process for a connector 1000I that includes a top cover 1048*a* with a metal shield 1049*a*, which may be similar to cover 1048 and metal shield 1049, that is electrically coupled with at least one of a top plurality of leads 1042. A cover 1055 with a metal shield 1049*b*, which may be similar to metal shield 1049, is not electrically coupled with at least one of the bottom plurality of leads 1044. In embodiments, if the metal shield 1049*a* is at a VSS potential, then one of the top plurality of leads 1042 will be at a VSS potential. At least one of the bottom plurality of leads 1044 may be used for power or an I/O signal.

Figure 10J:
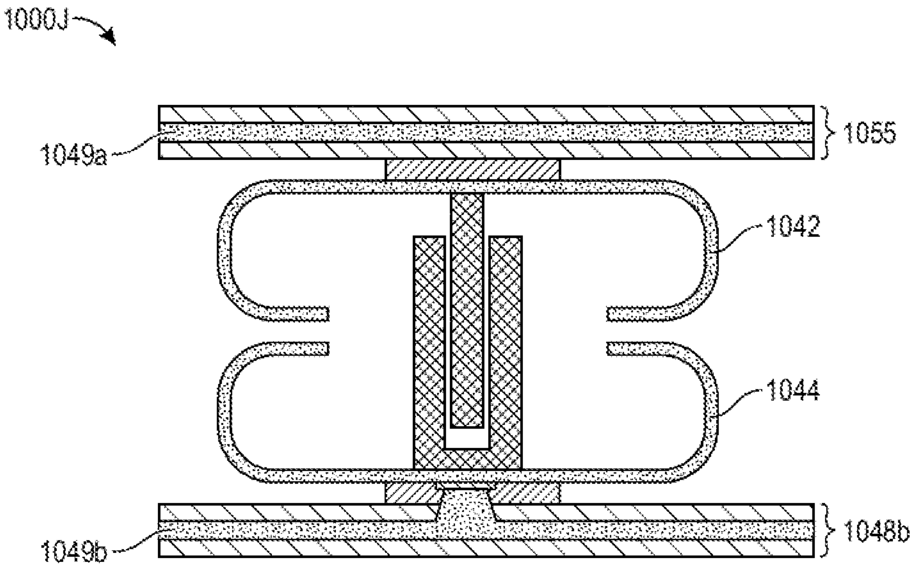

FIG. 10J illustrates a cross-section end view of a stage in the manufacturing process for a connector 1000J that includes a cover 1055, which may be a top cover, with a metal shield 1049*a*, which may be similar to metal shield 1049, that is not electrically coupled with at least one of a top plurality of leads 1042. A bottom cover 1048*b* with a metal shield 1049*b*, which may be similar to cover 1048 and metal shield 1049, is electrically coupled with at least one of the bottom plurality of leads 1044. In embodiments, if the metal shield 1049*b* is at a VSS potential, then one of the bottom plurality of leads 1044 will be at a VSS potential. At least one of the top plurality of leads 1042 may be used for power or an I/O signal.

Figure 11:
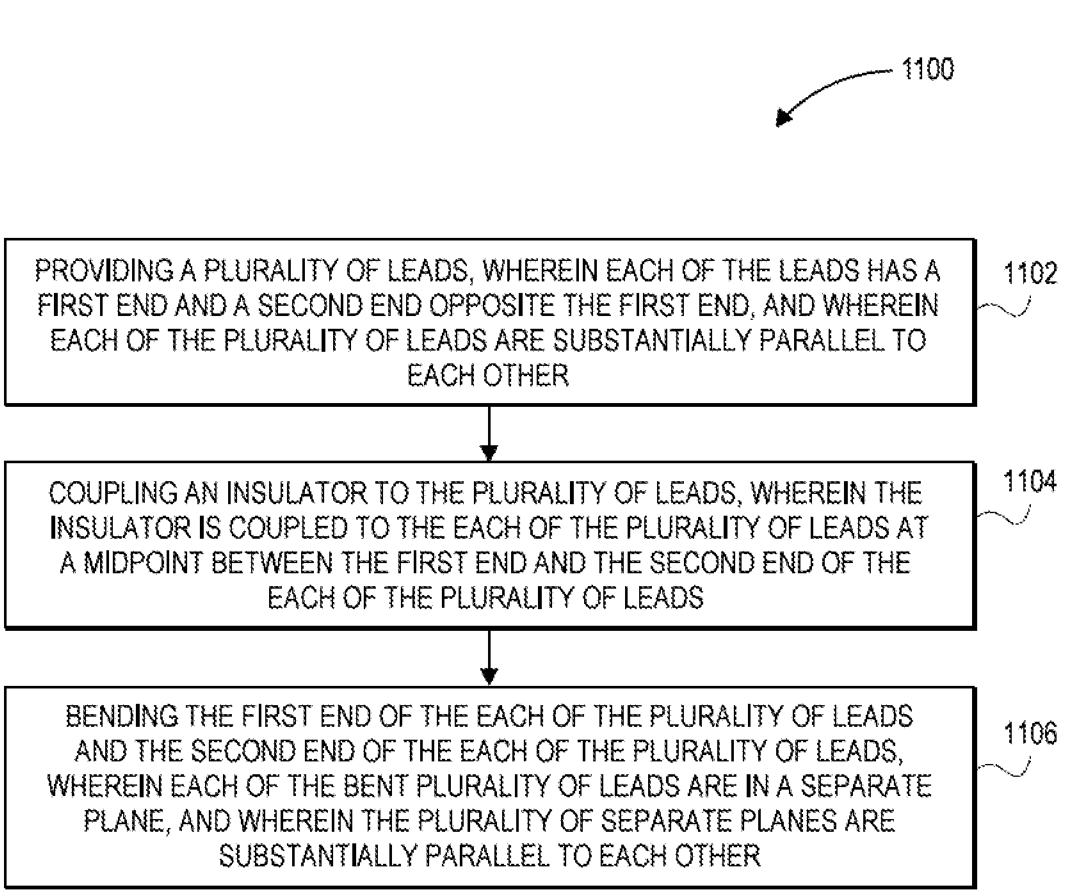
FIG. 11 illustrates an example of a process for creating a connector bridge, in accordance with various embodiments.

FIG. 11 illustrates an example of a process for creating a connector bridge, in accordance with various embodiments. Process 1100 may be performed using the tools, techniques, processes, systems, or apparatuses as described herein, and in particular with respect to FIGS. 1-10J.

At block 1102, the process may include providing a plurality of leads, wherein each of the leads has a first end and a second end opposite the first end, and wherein each of the plurality of leads are substantially parallel to each other.

At block 1104, the process may further include coupling an insulator to the plurality of leads, wherein the insulator is coupled to the each of the plurality of leads at a midpoint between the first end and the second end of the each of the plurality of leads.

At block 1106, the process may further include bending the first end of the each of the plurality of leads and the second end of the each of the plurality of leads, wherein each of the bent plurality of leads are in a separate plane, and wherein the plurality of separate planes are substantially parallel to each other.

Figure 12:
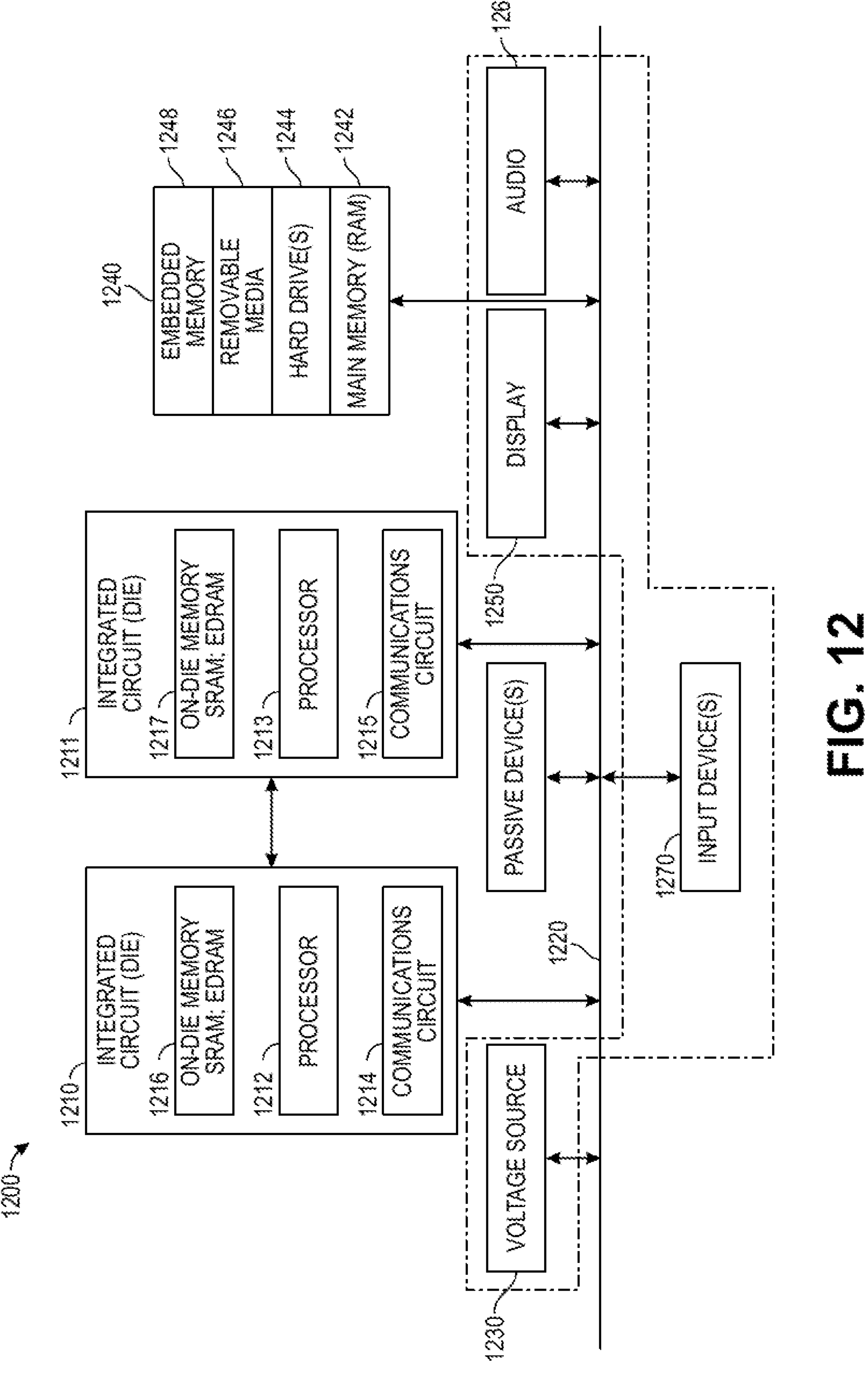
FIG. 12 schematically illustrates a computing device, in accordance with various embodiments.

FIG. 12 is a schematic of a computer system 1200, in accordance with an embodiment of the present invention. The computer system 1200 (also referred to as the electronic system 1200) as depicted can embody a connector to electrically couple multiple substrates, according to any of the several disclosed embodiments and their equivalents as set forth in this disclosure. The computer system 1200 may be a mobile device such as a netbook computer. The computer system 1200 may be a mobile device such as a wireless smart phone. The computer system 1200 may be a desktop computer. The computer system 1200 may be a hand-held reader. The computer system 1200 may be a server system. The computer system 1200 may be a supercomputer or high-performance computing system.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 may mean any type of circuit such as, but not limited to, a microprocessor, a microcontroller, a graphics processor, a digital signal processor, or another processor. In an embodiment, the processor 1212 includes, or is coupled with, a connector to electrically couple multiple substrates, as disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems, or a communications circuit for servers. In an embodiment, the integrated circuit 1210 includes on-die memory 1216 such as static random-access memory (SRAM). In an embodiment, the integrated circuit 1210 includes embedded on-die memory 1216 such as embedded dynamic random-access memory (eDRAM).

In an embodiment, the integrated circuit 1210 is complemented with a subsequent integrated circuit 1211. Useful embodiments include a dual processor 1213 and a dual communications circuit 1215 and dual on-die memory 1217 such as SRAM. In an embodiment, the dual integrated circuit 1210 includes embedded on-die memory 1217 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. The external memory 1240 may also be embedded memory 1248 such as the first die in a die stack, according to an embodiment.

In an embodiment, the electronic system 1200 also includes a display device 1250, an audio output 1260. In an embodiment, the electronic system 1200 includes an input device such as a controller 1270 that may be a keyboard, mouse, trackball, game controller, microphone, voice-recognition device, or any other input device that inputs information into the electronic system 1200. In an embodiment, an input device 1270 is a camera. In an embodiment, an input device 1270 is a digital sound recorder. In an embodiment, an input device 1270 is a camera and a digital sound recorder.

As shown herein, the integrated circuit 1210 can be implemented in a number of different embodiments, including a package substrate having a connector to electrically couple multiple substrates, according to any of the several disclosed embodiments and their equivalents, an electronic system, a computer system, one or more methods of fabricating an integrated circuit, and one or more methods of fabricating an electronic assembly that includes a package substrate having a connector to electrically couple multiple substrates, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a connector to electrically couple multiple substrates embodiments and their equivalents. A foundation substrate may be included, as represented by the dashed line of FIG. 12. Passive devices may also be included, as is also depicted in FIG. 12.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

EXAMPLES

The following paragraphs describe examples of various embodiments.

Example 1 is a connector comprising: a first insulator; a first plurality of leads coupled with the first insulator, wherein the first plurality of leads extend through the first insulator, wherein a first portion of each of the first plurality of leads extends away from a first side of the first insulator, and wherein a second portion of the each of the first plurality of leads extends away from a second side of the first insulator opposite the first side of the first insulator; a second insulator; a second plurality of leads coupled with the second insulator, wherein the second plurality of leads extend through the second insulator, wherein a first portion of each of the second plurality of leads extends away from a first side of the second insulator, and wherein a second portion of each of the second plurality of leads extends away from a second side of the second insulator opposite the first side of the second insulator; and wherein the first plurality of leads are substantially parallel with each other, wherein the second plurality of leads are substantially parallel with each other, and wherein the first plurality of leads is above the second plurality of leads.

Example 2 includes the connector of example 1, wherein at least some of the each of the first plurality of leads are electrically isolated from each other, and wherein at least some of the each of the second plurality of leads are electrically isolated from each other.

Example 3 includes the connector of examples 1 or 2, further comprising a slider, wherein the slider includes a first sliding component coupled with the first insulator and a second sliding component coupled with the second insulator, wherein the slider fixes an X-Y orientation of the first plurality of leads with respect to the second plurality of leads.

Example 4 includes the connector of example 3, wherein the first sliding component and the second sliding component are configured to vary a distance between the first plurality of leads and the second plurality of leads.

Example 5 includes the connector of examples 3 or 4, wherein the first sliding component inserts into the second sliding component.

Example 6 includes the connector of examples 1, 2, 3, 4 or 5, wherein at least some of the first plurality of leads and at least some of the second plurality of leads include a bend.

Example 7 includes the connector of examples 1, 2, 3, 4, 5 or 6, wherein the first plurality of leads and the second plurality of leads include copper.

Example 8 includes the connector of examples 1, 2, 3, 4, 5, 6, or 7, further comprising a first cover physically coupled with the first insulator, and a second cover physically coupled with the second insulator.

Example 9 includes the connector of example 8, wherein the first cover or the second cover includes an electrical feature.

Example 10 includes the connector of example 9, wherein the electrical feature is a metal shield.

Example 11 includes the connector of example 10, wherein the metal shield is electrically coupled with at least one of the first plurality of leads through an electrical connection through the first insulator, or wherein the metal shield is electrically coupled with at least one of the second plurality of leads through an electrical connection through the second insulator.

Example 12 includes the connector of examples 8, 9, 10, or 11, further comprising one or more locking mechanism, wherein each of the one or more locking mechanism are coupled to the first cover and to the second cover.

Example 13 includes the connector of example 12, wherein each of the one or more locking mechanisms includes a spring.

Example 14 is a system comprising: a first substrate having a first side and a second side opposite the first side, wherein the first substrate includes a first plurality of connectors on the first side of the first substrate at an edge of the first substrate, and wherein the first substrate includes a second plurality of connectors on the second side of the first substrate at the edge of the first substrate; a second substrate having a first side and a second side opposite the first side, wherein the second substrate includes a third plurality of connectors on the first side of the second substrate at an edge of the second substrate, and wherein the second substrate includes a fourth plurality of connectors on the second side of the second substrate at the edge of the second substrate; and a connector electrically and physically coupling the first substrate and the second substrate, wherein the connector includes a first plurality of leads that electrically couples the first plurality of connectors of the first side of the first substrate with the third plurality of connectors on the first side of the second substrate, and wherein the connector includes a second plurality of leads that electrically couples the second plurality of connectors on the second side of the first substrate with the fourth plurality of connectors on the second side of the second substrate.

Example 15 includes the system of example 14, wherein the connector further includes: a first insulator, wherein the first insulator is coupled with a first plurality of leads; a second insulator, wherein the second insulator is coupled with a second plurality of leads; and wherein the first insulator and the second insulator are between the first substrate and the second substrate.

Example 16 includes the system of example 15, wherein the first insulator and the second insulator are movably coupled with each other.

Example 17 includes the system of examples 15 or 16, further comprising a first cover physically coupled with the first insulator, and a second cover physically coupled with the second insulator.

Example 18 includes the system of example 17, wherein the first cover includes a first electrical shield and the second cover includes a second electrical shield.

Example 19 includes the system of example 18, wherein the first electrical shield is proximate to the first plurality of leads, and wherein the second electrical shield is proximate to the second plurality of leads.

Example 20 includes the system of examples 18 or 19, wherein the first electrical shield is electrically coupled with at least some of the first plurality of leads.

Example 21 includes the system of examples 14, 15, 16, 17, 18, 19, or 20, wherein the first plurality of connectors, the second plurality of connectors, the third plurality of connectors, and the fourth plurality of connectors include copper, and wherein the first plurality of leads and the second plurality of leads include copper.

Example 22 includes the system of examples 14, 15, 16, 17, 18, 19, 20, or 21, wherein the first substrate includes one or more processors that are electrically coupled with the first plurality of connectors or the second plurality of connectors, and wherein the second substrate includes one or more memory modules that are electrically coupled with the third plurality of connectors or the fourth plurality of connectors.

Example 23 is a method comprising: providing a plurality of leads, wherein each of the plurality of leads has a first end and a second end opposite the first end, and wherein the each of the plurality of leads are substantially parallel to each other; coupling an insulator to the plurality of leads, wherein the insulator is coupled to the each of the plurality of leads at a midpoint between the first end and the second end of the each of the plurality of leads; and bending the first end of the each of the plurality of leads and the second end of the each of the plurality of leads, wherein each of the bent plurality of leads are in a separate plane, and wherein the plurality of separate planes are substantially parallel to each other.

Example 24 includes the method of example 23, wherein the first end and the second end of the each of the plurality of leads are proximate to each other.

Example 25 includes the method of example 23 or 24, wherein the plurality of leads include copper.

What is claimed is:

1. A connector comprising:

a first insulator;

a first plurality of leads coupled with the first insulator, wherein the first plurality of leads extend through the first insulator, wherein a first portion of each of the first plurality of leads extends away from a first side of the first insulator, and wherein a second portion of the each of the first plurality of leads extends away from a second side of the first insulator opposite the first side of the first insulator;

a second insulator;

a second plurality of leads coupled with the second insulator, wherein the second plurality of leads extend through the second insulator, wherein a first portion of each of the second plurality of leads extends away from a first side of the second insulator, and wherein a second portion of each of the second plurality of leads extends away from a second side of the second insulator opposite the first side of the second insulator;

wherein the first plurality of leads are substantially parallel with each other, wherein the second plurality of leads are substantially parallel with each other, and wherein the first plurality of leads is above the second plurality of leads; and a slider, wherein the slider includes a first sliding component coupled with the first insulator and a second sliding component coupled with the second insulator, wherein the slider fixes an X-Y orientation of the first plurality of leads with respect to the second plurality of leads, and wherein the first sliding component and the second sliding component are configured to vary a distance between the first plurality of leads and the second plurality of leads.

2. The connector of claim 1, wherein at least some of the each of the first plurality of leads are electrically isolated from each other, and wherein at least some of the each of the second plurality of leads are electrically isolated from each other.

3. The connector of claim 1, wherein the first sliding component is configured to insert into the second sliding component.

4. The connector of claim 1, wherein at least some of the first plurality of leads and at least some of the second plurality of leads include a bend.

5. The connector of claim 1, wherein the first plurality of leads and the second plurality of leads include copper.

6. The connector of claim 1, further comprising a first cover physically coupled with the first insulator, and a second cover physically coupled with the second insulator.

7. The connector of claim 6, wherein the first cover or the second cover includes an electrical feature.

8. The connector of claim 7, wherein the electrical feature is a metal shield.

9. The connector of claim 8, wherein the metal shield is electrically coupled with at least one of the first plurality of leads through an electrical connection through the first insulator, or wherein the metal shield is electrically coupled with at least one of the second plurality of leads through an electrical connection through the second insulator.

10. The connector of claim 6, further comprising one or more locking mechanism, wherein each of the one or more locking mechanism are coupled to the first cover and to the second cover.

11. The connector of claim 10, wherein each of the one or more locking mechanisms includes a spring.

12. A system comprising:

a first substrate having a first side and a second side opposite the first side, wherein the first substrate includes a first plurality of connectors on the first side of the first substrate at an edge of the first substrate, and wherein the first substrate includes a second plurality of connectors on the second side of the first substrate at the edge of the first substrate;

a second substrate having a first side and a second side opposite the first side, wherein the second substrate includes a third plurality of connectors on the first side of the second substrate at an edge of the second substrate, and wherein the second substrate includes a fourth plurality of connectors on the second side of the second substrate at the edge of the second substrate;

a connector electrically and physically coupling the first substrate and the second substrate, wherein the connector includes a first plurality of leads that electrically couples the first plurality of connectors of the first side of the first substrate with the third plurality of connectors on the first side of the second substrate, and wherein the connector includes a second plurality of leads that electrically couples the second plurality of connectors on the second side of the first substrate with the fourth plurality of connectors on the second side of the second substrate, wherein the connector further includes:

a first insulator, wherein the first insulator is coupled with a first plurality of leads;

a second insulator, wherein the second insulator is coupled with a second plurality of leads; and wherein the first insulator and the second insulator are between the first substrate and the second substrate; and a first cover physically coupled with the first insulator, and a second cover physically coupled with the second insulator, wherein the first cover includes a first electrical shield and the second cover includes a second electrical shield, wherein the first electrical shield is electrically coupled with at least some of the first plurality of leads.

13. The system of claim 12, wherein the first insulator and the second insulator are movably coupled with each other.

14. The system of claim 12, wherein the first electrical shield is proximate to the first plurality of leads, and wherein the second electrical shield is proximate to the second plurality of leads.

15. The system of claim 12, wherein the first plurality of connectors, the second plurality of connectors, the third plurality of connectors, and the fourth plurality of connectors include copper, and wherein the first plurality of leads and the second plurality of leads include copper.

16. The system of claim 12, wherein the first substrate includes one or more processors that are electrically coupled with the first plurality of connectors or the second plurality of connectors, and wherein the second substrate includes one or more memory modules that are electrically coupled with the third plurality of connectors or the fourth plurality of connectors.

17. A connector comprising:

a first insulator;

a first plurality of leads coupled with the first insulator, wherein the first plurality of leads extend through the first insulator, wherein a first portion of each of the first plurality of leads extends away from a first side of the first insulator, and wherein a second portion of the each of the first plurality of leads extends away from a second side of the first insulator opposite the first side of the first insulator;

a second insulator;

a second plurality of leads coupled with the second insulator, wherein the second plurality of leads extend through the second insulator, wherein a first portion of each of the second plurality of leads extends away from a first side of the second insulator, and wherein a second portion of each of the second plurality of leads extends away from a second side of the second insulator opposite the first side of the second insulator;

wherein the first plurality of leads are substantially parallel with each other, wherein the second plurality of leads are substantially parallel with each other, and wherein the first plurality of leads is above the second plurality of leads; and a slider, wherein the slider includes a first sliding component coupled with the first insulator and a second sliding component coupled with the second insulator, wherein the slider fixes an X-Y orientation of the first plurality of leads with respect to the second plurality of leads, and wherein the first sliding component is configured to insert into the second sliding component.

18. A connector comprising:

a first insulator;

a first plurality of leads coupled with the first insulator, wherein the first plurality of leads extend through the first insulator, wherein a first portion of each of the first plurality of leads extends away from a first side of the first insulator, and wherein a second portion of the each of the first plurality of leads extends away from a second side of the first insulator opposite the first side of the first insulator;

a second insulator;

a second plurality of leads coupled with the second insulator, wherein the second plurality of leads extend through the second insulator, wherein a first portion of each of the second plurality of leads extends away from a first side of the second insulator, and wherein a second portion of each of the second plurality of leads extends away from a second side of the second insulator opposite the first side of the second insulator;

wherein the first plurality of leads are substantially parallel with each other, wherein the second plurality of leads are substantially parallel with each other, and wherein the first plurality of leads is above the second plurality of leads; and a first cover physically coupled with the first insulator, and a second cover physically coupled with the second insulator, wherein the first cover or the second cover includes an electrical feature, wherein the electrical feature is a metal shield, wherein the metal shield is electrically coupled with at least one of the first plurality of leads through an electrical connection through the first insulator, or wherein the metal shield is electrically coupled with at least one of the second plurality of leads through an electrical connection through the second insulator.

19. A connector comprising:

a first insulator;

a first plurality of leads coupled with the first insulator, wherein the first plurality of leads extend through the first insulator, wherein a first portion of each of the first plurality of leads extends away from a first side of the first insulator, and wherein a second portion of the each of the first plurality of leads extends away from a second side of the first insulator opposite the first side of the first insulator;

a second insulator;

a second plurality of leads coupled with the second insulator, wherein the second plurality of leads extend through the second insulator, wherein a first portion of each of the second plurality of leads extends away from a first side of the second insulator, and wherein a second portion of each of the second plurality of leads extends away from a second side of the second insulator opposite the first side of the second insulator;

wherein the first plurality of leads are substantially parallel with each other, wherein the second plurality of leads are substantially parallel with each other, and wherein the first plurality of leads is above the second plurality of leads;

a first cover physically coupled with the first insulator, and a second cover physically coupled with the second insulator; and one or more locking mechanism, wherein each of the one or more locking mechanism are coupled to the first cover and to the second cover, wherein each of the one or more locking mechanisms includes a spring.

* * * * *